(12) United States Patent
Kwon et al.

(10) Patent No.: US 12,444,703 B2
(45) Date of Patent: Oct. 14, 2025

(54) MANUFACTURING METHOD OF SEMICONDUCTOR CHIP

(71) Applicant: SAMSUNG ELECTRONICS CO., LTD., Suwon-si (KR)

(72) Inventors: Yongbum Kwon, Yongin-si (KR); Unbyoung Kang, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 482 days.

(21) Appl. No.: 17/931,796

(22) Filed: Sep. 13, 2022

(65) Prior Publication Data

US 2023/0114550 A1    Apr. 13, 2023

(30) Foreign Application Priority Data

Oct. 12, 2021    (KR) .......................... 10-2021-0134696

(51) Int. Cl.
*H01L 25/065*    (2023.01)
*H01L 23/00*    (2006.01)

(52) U.S. Cl.
CPC .............. *H01L 24/03* (2013.01); *H01L 24/05* (2013.01); *H01L 24/08* (2013.01); *H01L 24/80* (2013.01); *H01L 25/0657* (2013.01); *H01L 24/16* (2013.01); *H01L 2224/03002* (2013.01); *H01L 2224/0346* (2013.01); *H01L 2224/03602* (2013.01); *H01L 2224/03616* (2013.01); *H01L 2224/03901* (2013.01); *H01L 2224/05005* (2013.01); *H01L 2224/05011* (2013.01); *H01L 2224/05078* (2013.01); *H01L 2224/05166* (2013.01); *H01L 2224/05181* (2013.01); *H01L 2224/05187* (2013.01); *H01L 2224/05541* (2013.01); *H01L 2224/05551* (2013.01); *H01L 2224/05557* (2013.01);
(Continued)

(58) Field of Classification Search
CPC ..... H01L 25/0657; H01L 24/08; H01L 24/05; H01L 24/80
See application file for complete search history.

(56) References Cited

U.S. PATENT DOCUMENTS 6,169,028 B1   1/2001   Wang et al.
8,089,163 B2   1/2012   Tanida et al.
(Continued)

FOREIGN PATENT DOCUMENTS

KR   10-2003-0025618 A   3/2003
KR      20060079316 A    7/2006
(Continued)

*Primary Examiner* — Dale E Page
*Assistant Examiner* — Wilner Jean Baptiste
(74) *Attorney, Agent, or Firm* — Wolf, Greenfield & Sacks, P.C.

(57) ABSTRACT

A method of manufacturing a semiconductor chip is provided. The method includes: forming a plurality of bonding pads on a semiconductor wafer, sequentially forming an insulating layer and a polishing stop film on the semiconductor wafer to cover the plurality of bonding pads, the insulating layer and the polishing stop film having a plurality of convex portions corresponding to upper portions of the plurality of bonding pads, polishing the plurality of convex portions using the polishing stop film to expose upper surfaces of the plurality of bonding pads, and removing the polishing stop film.

20 Claims, 22 Drawing Sheets

(52) U.S. Cl.
CPC ............... *H01L 2224/05578* (2013.01); *H01L 2224/05582* (2013.01); *H01L 2224/05647* (2013.01); *H01L 2224/05666* (2013.01); *H01L 2224/05681* (2013.01); *H01L 2224/05687* (2013.01); *H01L 2224/08145* (2013.01); *H01L 2224/16227* (2013.01); *H01L 2224/80006* (2013.01); *H01L 2224/80203* (2013.01); *H01L 2224/8083* (2013.01); *H01L 2224/80895* (2013.01); *H01L 2224/80896* (2013.01); *H01L 2225/06524* (2013.01); *H01L 2225/06527* (2013.01); *H01L 2225/06541* (2013.01); *H01L 2924/1431* (2013.01); *H01L 2924/1436* (2013.01)

(56) References Cited

U.S. PATENT DOCUMENTS

| | | |
|---|---|---|
| 9,142,517 B2 | 9/2015 | Liu et al. |
| 9,461,007 B2 | 10/2016 | Chun et al. |
| 9,520,361 B2 | 12/2016 | Kang et al. |
| 10,354,975 B2 | 7/2019 | Soares et al. |
| 2003/0022482 A1 | 1/2003 | Nagashima |
| 2011/0068466 A1* | 3/2011 | Chen .................. H01L 21/76898 257/737 |
| 2013/0277842 A1* | 10/2013 | Baumann .......... H01L 23/53238 257/E23.161 |

FOREIGN PATENT DOCUMENTS

| | | |
|---|---|---|
| KR | 20080013565 A | 2/2008 |
| KR | 10-2016-0057077 A | 5/2016 |

\* cited by examiner

MANUFACTURING METHOD OF SEMICONDUCTOR CHIP

CROSS-REFERENCE TO RELATED APPLICATION

This application claims the priority and benefit of Korean Patent Application No. 10-2021-0134696, filed on Oct. 12, 2021, with the Korean Intellectual Property Office, the disclosure of which is incorporated herein by reference in its entirety.

BACKGROUND

1. Field

The present inventive concept relates to methods of manufacturing a semiconductor chip.

2. Description of Related Art

Efforts to improve a degree of integration of various semiconductor packages such as logic circuits and memories are ongoing. As a method for integrating more components (e.g., semiconductor chips) into a single package structure, a stacking technology such as a three dimensional integrated circuit (3D IC) may be used.

3D IC technology may provide advantages of a high degree of integration, a high processing speed, and a wide bandwidth by reducing a length of interconnections between stacked chips using direct bonding. Conventionally, a bonding pad for interconnection has been manufactured using a damascene process. However, a damascene process may cause difficulty in achieving a high degree of bonding pad flatness for direct bonding.

SUMMARY

An aspect of the present inventive concept is to provide methods of manufacturing a semiconductor chip having improved reliability.

According to an aspect of the present inventive concept, a method of manufacturing a semiconductor chip, includes: forming a photoresist pattern having a plurality of openings on a semiconductor wafer, each of the plurality of openings defining a bonding pad formation region, forming a plurality of bonding pads, each bonding pad in a respective one of the plurality of openings, removing the photoresist pattern, sequentially forming an insulating layer and a polishing stop film on the semiconductor wafer and the plurality of bonding pads, wherein the insulating layer and the polishing stop film form a plurality of convex portions, each convex portion above a respective one of the plurality of bonding pads, polishing the plurality of convex portions to expose a plurality of regions of the insulating layer, dry etching the exposed plurality of regions of the insulating layer to form a groove in each of the exposed plurality of regions of the insulating layer, further polishing the plurality of convex portions to expose an upper surface of each of the plurality of bonding pads, and removing the polishing stop film to expose the insulating layer.

According to an aspect of the present inventive concept, a method of manufacturing a semiconductor chip, includes: forming a plurality of bonding pads on a semiconductor wafer, sequentially forming an insulating layer and a polishing stop film on the semiconductor wafer and the plurality of bonding pads, wherein the insulating layer and the polishing stop film form a plurality of convex portions, each convex portion above a respective one of the plurality of bonding pads, polishing the plurality of convex portions to expose an upper surface of each of the plurality of bonding pads, and removing the polishing stop film.

According to an aspect of the present inventive concept, a method of manufacturing a semiconductor chip is provided. The method includes: forming a plurality of bonding pads on a semiconductor wafer, forming a first insulating layer on the plurality of bonding pads, sequentially forming a second insulating layer and a polishing stop film on the first insulating layer, the second insulating layer and the polishing stop film forming a plurality of convex portions, each convex portion above a respective one of the plurality of bonding pads, polishing the plurality of convex portions to expose an upper surface of each of the plurality of bonding pads, and removing the polishing stop film, wherein the first insulating layer and the second insulating layer comprise different materials.

BRIEF DESCRIPTION OF DRAWINGS

The above and other aspects, features, and advantages of the present inventive concept will be more clearly understood from the following detailed description taken in conjunction with the accompanying drawings, in which.

DETAILED DESCRIPTION

Hereinafter, example embodiments of the present inventive concept will be described with reference to the accompanying drawings as follows.

Figure 1:
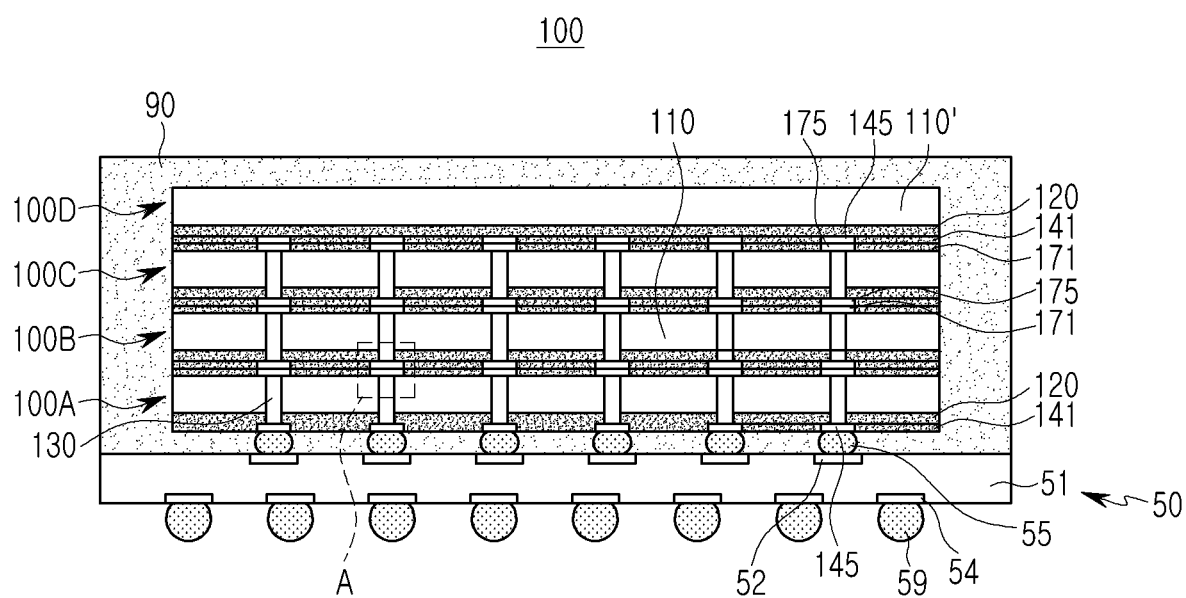
FIG. 1 is a side cross-sectional view illustrating a semiconductor package according to an example embodiment of the present inventive concept.
Figure 2:
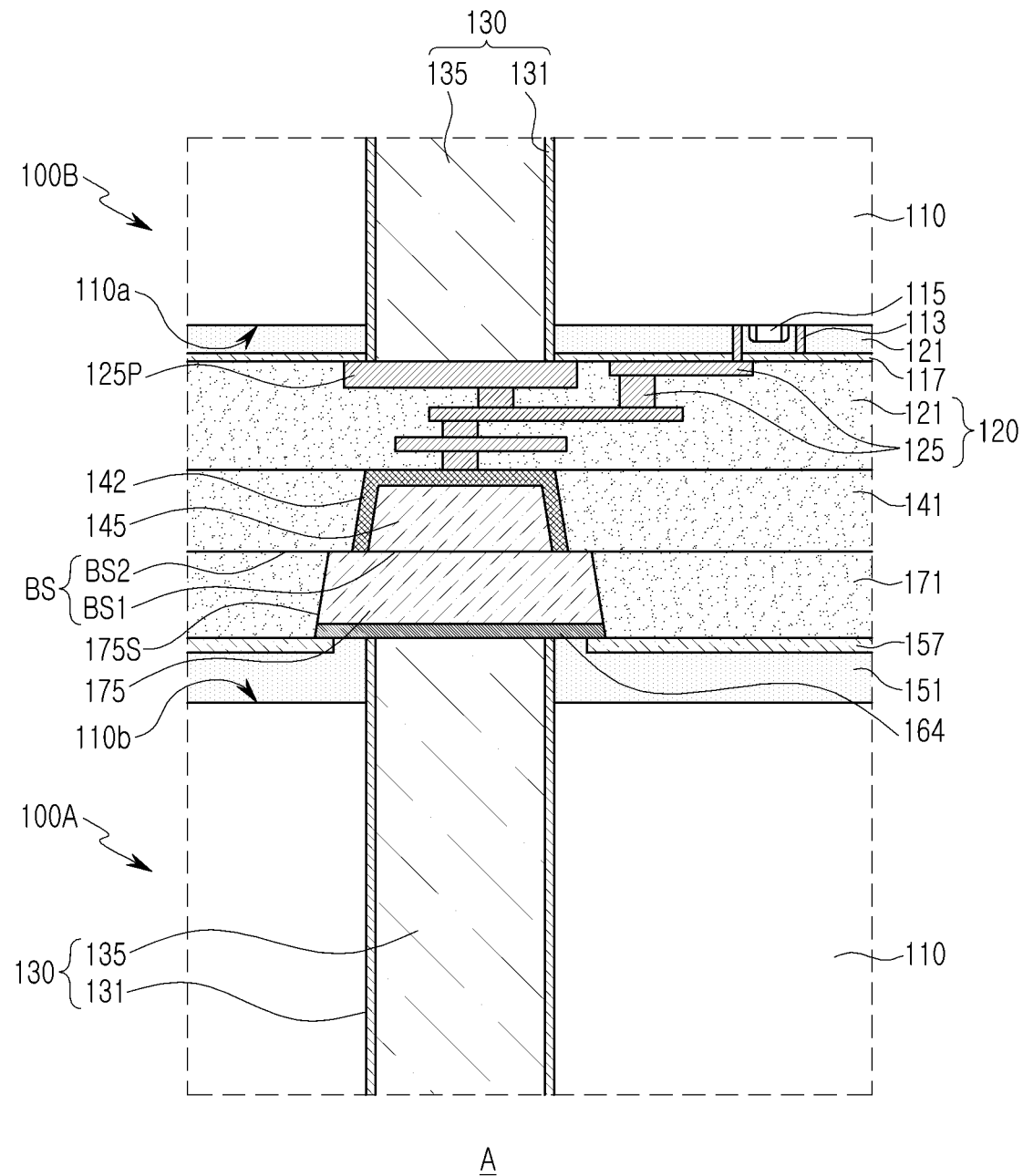
FIG. 2 is a partially enlarged view illustrating a portion "A" of the semiconductor package illustrated in FIG. 1.

FIG. 1 is a side cross-sectional view illustrating a semiconductor package according to an example embodiment of the present inventive concept, while FIG. 2 is a partially enlarged view illustrating portion "A" of the semiconductor package illustrated in FIG. 1.

Referring to FIGS. 1 and 2, a semiconductor package 100 may include first to fourth semiconductor chips 100A, 100B, 100C, and 100D stacked on a package substrate 50, and a molding member 90 surrounding the first to fourth semiconductor chips 100A, 100B, 100C, and 100D.

The package substrate 50 may include an upper pad 52 and a lower pad 54 respectively disposed on upper and lower surfaces of a substrate body 51. The substrate body 51 may include an internal interconnection (not illustrated) connecting the upper pad 52 and the lower pad 54. For example, the package substrate 50 may include a printed circuit board (PCB) or a silicon interposer substrate (Si interposer substrate). In addition, the semiconductor package 100 may further include conductive bumps 55 connected to the first semiconductor chip 100A and external connection terminals 59 for connecting to an external device (e.g., a motherboard).

In the present example embodiment, the first semiconductor chip 100A may have substantially the same or similar structure as the second to fourth semiconductor chips 100B, 100C, and 100D, and the same or similar components are denoted by the same or similar reference numerals, and repeated descriptions of the same components may be omitted. However, unlike other semiconductor chips, the fourth semiconductor chip 100D disposed in an uppermost portion may not include a through electrode, and may have a relatively large thickness.

Specifically, the first to third semiconductor chips 100A, 100B, and 100C may include a substrate 110, an wiring structure 120, a through electrode 130, a lower bonding pad 145, and an upper bonding pad 175, respectively. However, the fourth semiconductor chip 100D disposed in an uppermost portion may include other components in the same manner except for the through electrode 130.

The substrate 110 may have a first surface 110a having an active region and a second surface 110b positioned opposite to the first surface 110a. The first surface 110a and the second surface 110b are also referred to as an active surface and an inactive surface, respectively. A plurality of individual devices 115 such as transistors may be formed on the first surface 110a (i.e., the active region) of the substrate 110. An interlayer insulating layer 117 covering a plurality of individual devices 115 may be formed on the first surface 110a of the substrate 110, and the plurality of individual devices 115 may be connected to an interconnection portion 113 (e.g., a contact plug). A wiring structure 120 having a low dielectric layer 121 and a plurality of wiring layers 125 may be disposed on the interlayer insulating layer 117, and the wiring layers 125 may be connected to the plurality of individual devices 115 through the interconnection portion 113. The wiring layers 125 may include a multilayer structure including wiring patterns and vias. In addition, the wiring structure 120 may be connected to the through electrode 130. For example, as illustrated in FIG. 2, the wiring layers 125 may include a landing pad 125P connected to the through electrode 130. For example, as illustrated in FIG. 2, the wiring layers 125 may include a landing pad 125P connected to the through electrode 130.

The interlayer insulating layer 117 or the low dielectric layer 121 may include Flowable Oxide (FOX), Tonen Sila-Zen (TOSZ), Undoped Silica Glass (USG), Borosilica Glass (BSG), PhosphoSilaca Glass (PSG), BoroPhosphoSilica Glass (BPSG), Plasma Enhanced Tetra Ethyl Ortho Silicate (PETEOS), Fluoride Silicate Glass (FSG), High Density Plasma (HDP) oxide, Plasma Enhanced Oxide (PEOX), Flowable CVD (FCVD) oxide, or a combination thereof. The interlayer insulating layer 117 or the low dielectric layer 121 may be formed using a chemical vapor deposition (CVD), a flowable-CVD process, or a spin coating process.

Referring to FIG. 2, an insulating protective layer 151 disposed on the second surface 110b of the substrate 110 may be included, and the through electrode 130 may be formed to penetrate through the substrate 110 and the interlayer insulating layer 117 and the insulating protective layer 151. The through electrode 130 may include a via plug 135 and a side insulating layer 131 surrounding a side surfaces of the via plug 135. The side insulating layer 131 may electrically isolate the via plug 135 from the substrate 110.

A lower insulating layer 141 disposed on a lower surface of each of the first to fourth semiconductor chips 100A, 100B, 100C, and 100D, that is, a wiring structure 120, and a lower bonding pad 145 disposed on the lower insulating layer 141 to be connected to the wiring layer 125 may be included. In addition, an upper insulating layer 171 disposed on an upper surface of each of the first to third semiconductor chips 100A, 100B, and 100C, that is, on a buffer film 157, and an upper bonding pad 175 disposed on the upper insulating layer 171 to be connected to the through electrode 130 may be included. In each of the first to third semiconductor chips 100A, 100B, and 100C, the upper and lower bonding pads 145 and 175 may be vertically connected by the through electrode 130 together with the wiring layer 125.

In this embodiment, the first to fourth semiconductor chips 100A, 100B, 100C, and 100D may be stacked by hybrid bonding. As illustrated in FIG. 2, in bonding the first and second semiconductor chips 100A and 100B, together with an intermetal bonding interface BS1 by the lower bonding pad 145 and the upper bonding pad 175 and the lower insulating layer 141, a hybrid bonding interface BS may be formed by coupling an interdielectric bonding interface BS2 between the lower insulating layer 141 and the upper insulating layer 171. Similarly thereto, bonding of the second and third semiconductor chips 100B and 100C and the third and fourth semiconductor chips 100C and 100D may be implemented.

Specifically, as illustrated in FIG. 2, the upper bonding pad 175 of the first semiconductor chip 100A and the lower bonding pad 145 of the second semiconductor chip 100B may be directly bonded to each other for electrical connection between the first and second semiconductor chips 100A and 100B, such that bonding of the first and second semiconductor chips 100A and 100B may be implemented.

The lower bonding pad 145 and the upper bonding pad 175 may include the same metal, for example, copper (Cu). The lower bonding pad 145 and the upper bonding pad 175, which are directly bonded, may be bonded by copper interdiffusion through a high-temperature annealing process. Metal constituting the lower bonding pad 145 and the upper bonding pad 175 is not limited to copper, and another metal material (e.g., Au) that may be similarly coupled to each other may be included. Through such metal bonding, it is possible to achieve strong bonding of stacked semiconductor chips and electrical connection through direct bonding without any additional connection bumps. A path for transmitting and receiving at least one of a control signal, a power signal, a ground signal, and a data signal may be provided between the first to fourth semiconductor chips 100A, 100B, 100C, and 100D. Since connection bumps such as solder are not used, transmission loss can be reduced.

In addition, the upper insulating layer 171 respectively disposed on upper surfaces of the first to third semiconductor chips 100A, 100B, and 100C, and the lower insulating layer 141 respectively disposed on lower surfaces of the second to fourth semiconductor chips 100B, 100C, and 100D may be directly bonded. The upper insulating layer 171 and the lower insulating layer 141 may include the same or similar materials. For example, the upper insulating layer 171 and the lower insulating layer 141 may include at least one of silicon oxide ($SiO_2$), silicon nitride (SiN), silicon carbide (SiC), silicon oxynitride (SiON), silicon carbonitride (SiCN), aluminum nitride (AlN), aluminum oxynitride (AlON), aluminum oxide (AlO), and aluminum oxide carbide (AlOC).

The upper bonding pad 175 employed in this embodiment may be formed by a process different from that of the lower bonding pad 145. For example, the lower bonding pad 145 may be formed by a conventional damascene process, whereas the upper bonding pad 175 may be formed by a novel process including a photoresist process and a planarization process using a polishing stop film. The upper bonding pad 175 formed by the novel process may have different structural characteristics from the lower bonding pad 145.

As illustrated in FIG. 2, the lower bonding pad 145 may have a width that increases in a direction toward a bonding interface BS, whereas the upper bonding pad 175 employed in this embodiment may have a width that decreases in a direction toward the bonding interface BS. With respect to the lower bonding pad 145, after forming the lower insulating layer 141 in advance, an opening for the lower bonding pad 145 may be formed, and after forming a conductive barrier layer 142 in the opening, the lower bonding pad 145 may be formed using a plating process. The conductive barrier layer 142 may include at least one of titanium (Ti), titanium nitride (TiN), tantalum (Ta), and tantalum nitride (TaN).

On the other hand, the upper bonding pad 175 may have a side surface 175S inclined toward the bonding interface BS, and may be in direct contact with the upper insulating layer 171. That is, the upper bonding pad 175 and the upper insulating layer 171 may be in direct contact with each other without an additional metal layer. Accordingly, galvanic corrosion may be prevented from occurring on the side surface of the upper bonding pad 175 by interposing a metal layer different from that of the upper bonding pad 175 between the upper bonding pad 175 and the upper insulating layer 171. The upper bonding pads 175 may be formed to have a diameter of at least 8 μm or less. In addition, the upper bonding pad 175 may be disposed to be spaced apart from the other upper bonding pads 175 by at least 12 μm or more.

Figure 3:
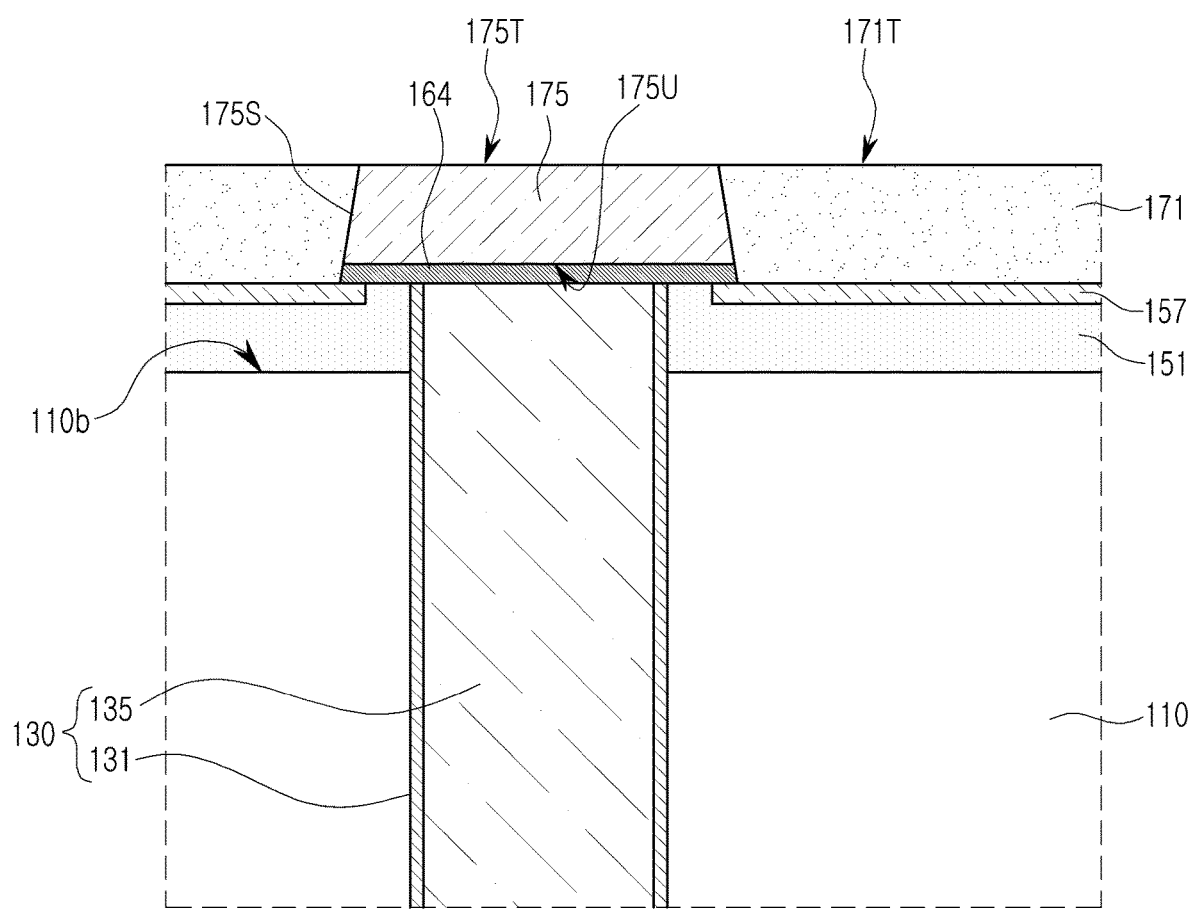
FIG. 3 is a partially enlarged view of a semiconductor chip employed in the semiconductor package illustrated in FIG. 2.

A seed layer 164 may be disposed on a lower surface 175U (FIG. 3) of the upper bonding pad 175. Specifically, as illustrated in FIGS. 2 and 3, a seed layer 164 may be disposed on the insulating protective layer 151 to be positioned between the upper bonding pad 175 and the through electrode 130. The seed layer 164 may include the same material as the upper bonding pad 175. Accordingly, the seed layer 164 may be used as a seed for a plating process for forming the upper bonding pad 175. For example, the seed layer 164 may include copper (Cu), chromium—copper (Cr—Cu), palladium (Pd), platinum (Pt), gold (Au), or a combination thereof. In some example embodiments, the seed layer 164 may include Cu. In addition, the seed layer 164 may have a multilayer structure of a lower layer including titanium (Ti) and an upper layer including copper (Cu).

As illustrated in FIG. 3, the upper bonding pad 175 may have a substantially flat upper surface 175T, the upper bonding pad 175 may have a substantially flat upper surface 175T with an upper surface 171T of the upper insulating layer 171. As described above, hybrid bonding employed in this embodiment may be implemented by a metal bonding structure in which the upper bonding pad 175 and the lower bonding pad 145 are directly bonded, and a dielectric bonding structure in which the upper insulating layer 171 and the lower insulating layer 141 are directly bonded. In addition, bonding of the second and third semiconductor chips 100B and 100C and bonding of the third and fourth semiconductor chips 100C and 100D may also be implemented by the hybrid bonding described with reference to FIG. 2.

The first to fourth semiconductor chips 100A, 100B, 100C, and 100D may be memory chips or logic chips. In this embodiment, the first to fourth semiconductor chips 100A, 100B, 100C, and 100D may all be the same type of memory chips, and in another example, a portion of the first to fourth semiconductor chips 100A, 100B, 100C, and 100D may be memory chips, and the other portion of the first to fourth semiconductor chips 100A, 100B, 100C, and 100D may be logic chips.

For example, the memory chip may be a volatile memory chip such as a Dynamic Random Access Memory (DRAM) or a Static Random Access Memory (SRAM), or a nonvolatile memory chip such as a Phase-change Random Access Memory (PRAM), a Magnetoresistive Random Access Memory (MRAM), a Ferroelectric Random Access Memory (FeRAM), or a Resistive Random Access Memory (RRAM). In some example embodiments, the first to fourth semiconductor chips 100A, 100B, 100C, and 100D may be high bandwidth memory (HBM) DRAMs.

In this embodiment, the first to fourth semiconductor chips 100A, 100B, 100C, and 100D may be stacked on the package substrate 50. The semiconductor package according to the present example embodiment has been exemplified as including four identical semiconductor chips 100A, 100B, 100C, and 100D as a multi-chip package, but the present example embodiment is not limited thereto. The semiconductor package may include a different number of semiconductor chips, and different kinds of semiconductor chips can be stacked thereon.

Figure 4:
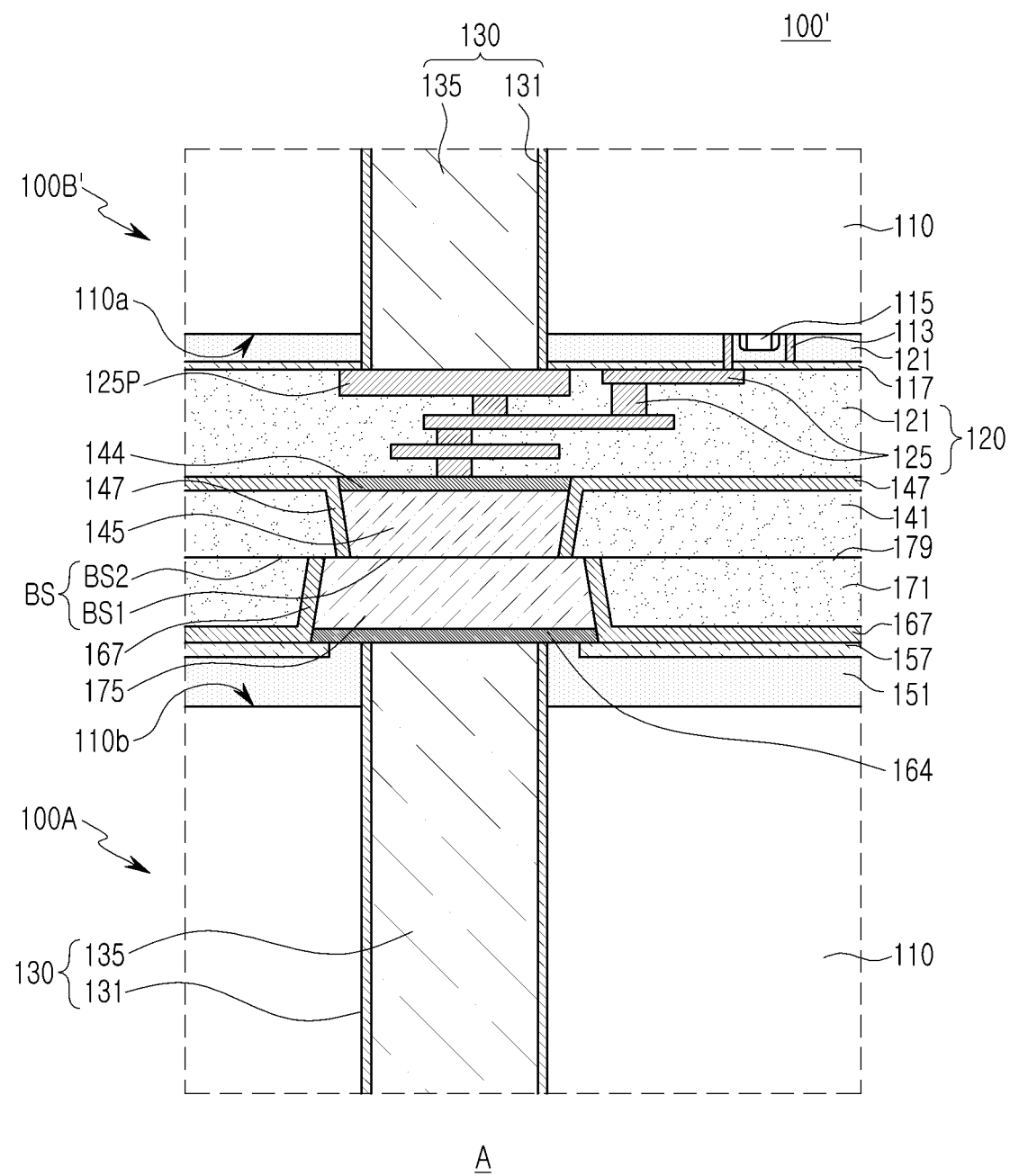
FIG. 4 is a partially enlarged view illustrating a bonding interface of semiconductor chips of a semiconductor package according to an example embodiment of the present inventive concept.
Figure 5:
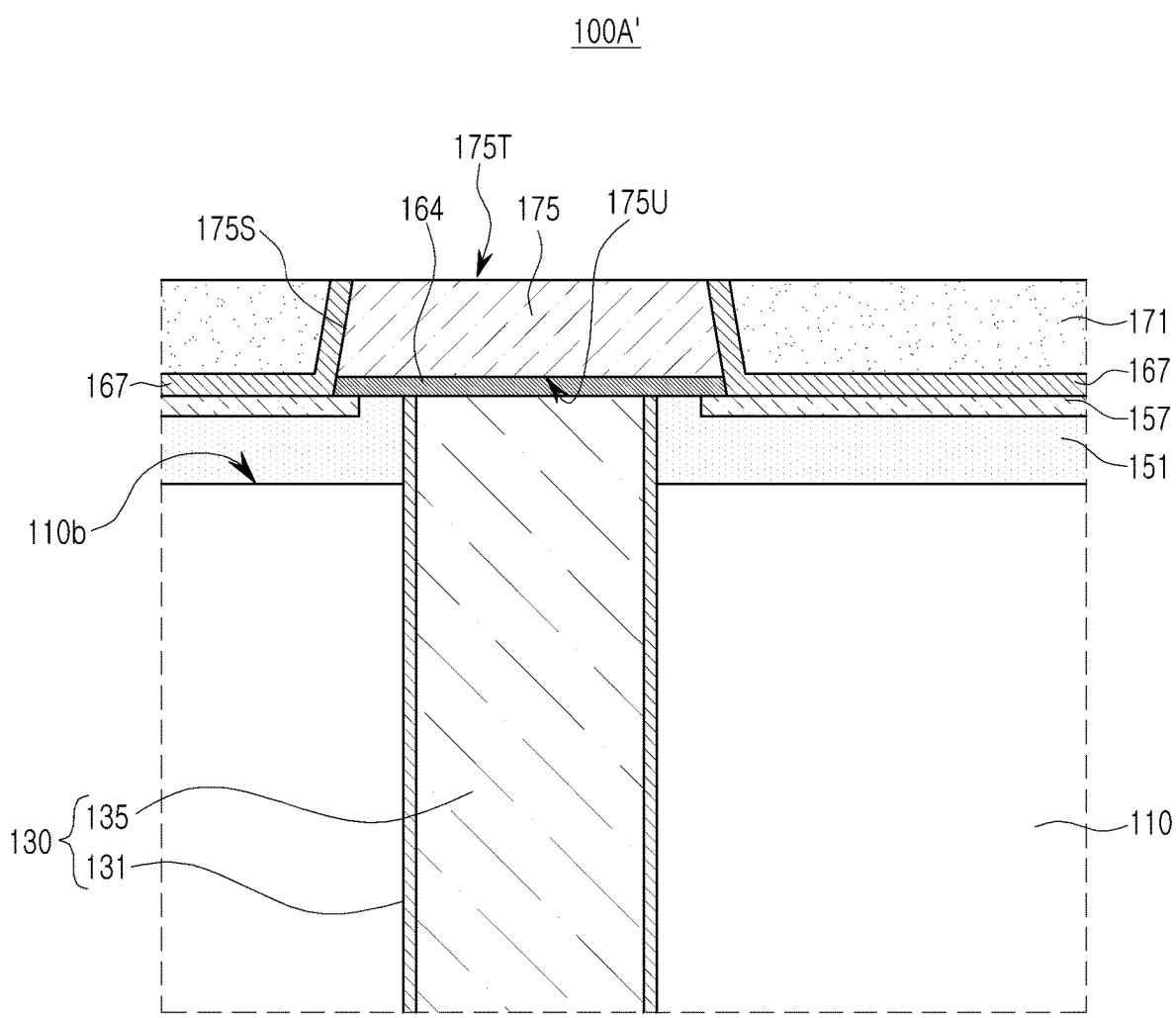
FIG. 5 is a partially enlarged view of a semiconductor chip employed in a semiconductor package according to an example embodiment of the present inventive concept.

FIG. 4 is a partially enlarged view illustrating a portion (a bonding interface of semiconductor chips) of a semiconductor package according to an example embodiment of the present inventive concept, and FIG. 5 is a partially enlarged view of a semiconductor chip employed in a semiconductor package according to an example embodiment of the present inventive concept.

Here, FIG. 4 is a portion corresponding to portion A of FIG. 1 similarly to FIG. 2, and FIG. 5 may be a partially enlarged view of one (before bonding) semiconductor chip, similar to FIG. 3.

Referring to FIGS. 4 and 5, a semiconductor package 100' according to the present example embodiment may be understood as having a structure similar to that of the semiconductor package 100 illustrated in FIGS. 1 to 3, except that the semiconductor package 100' has a different structure of a lower bonding pad 145 of a second semiconductor chip 100B', and an upper insulating layer 171 and a lower insulating layer 141 are comprised of a composite film. Components of the present example embodiment may be understood with reference to descriptions of the same or similar components of the semiconductor package 100 illustrated in FIGS. 1 to 3, unless otherwise specified.

The lower bonding pad 145 employed in the present example embodiment may be formed by a process similar to that of the upper bonding pad 175. As illustrated in FIG. 4, the lower bonding pad 145 may have a width that becomes narrower (i.e., decreases) in a direction toward a bonding interface. That is, the lower bonding pad 145 has a side inclined toward the bonding interface, and a capping insulating layer 147 may be formed to extend from a side surface of the lower bonding pad 145 and a side surface of the wiring structure 120, as illustrated in FIG. 4.

A capping insulating layer 167 may be continuously formed on a side surface 175S of the upper bonding pad 175 and an upper surface of the buffer film 157. The capping insulating layer 167 employed in this embodiment may be formed of an insulating material. The capping insulating layer 167 may include the same or similar material as the buffer film 157. For example, the capping insulating layer 167 may include at least one of silicon nitride (SiN), silicon carbide (SiC), silicon oxynitride (SiON), silicon carbonitride (SiCN), aluminum nitride (AlN), aluminum oxynitride (AlON), aluminum oxide (AlO), and aluminum oxide carbide (AlOC). In some example embodiments, the capping insulating layer 167 may be formed to have a thickness similar to that of the seed layer 164.

A seed layer 144 (FIG. 4) may be disposed on an upper surface of the lower bonding pad 145 to be connected to the wiring structure 120. The lower bonding pad 145 may have a lower surface substantially flat to a lower surface of the lower insulating layer 141.

FIGS. 6A to 6D are cross-sectional views for each main process for illustrating a method of manufacturing a semiconductor chip according to an example embodiment of the present inventive concept. The manufacturing method according to the present example embodiment may be understood as the method of manufacturing the first semiconductor chip 100A described with reference to FIGS. 1 to 3.

Figure 6A:
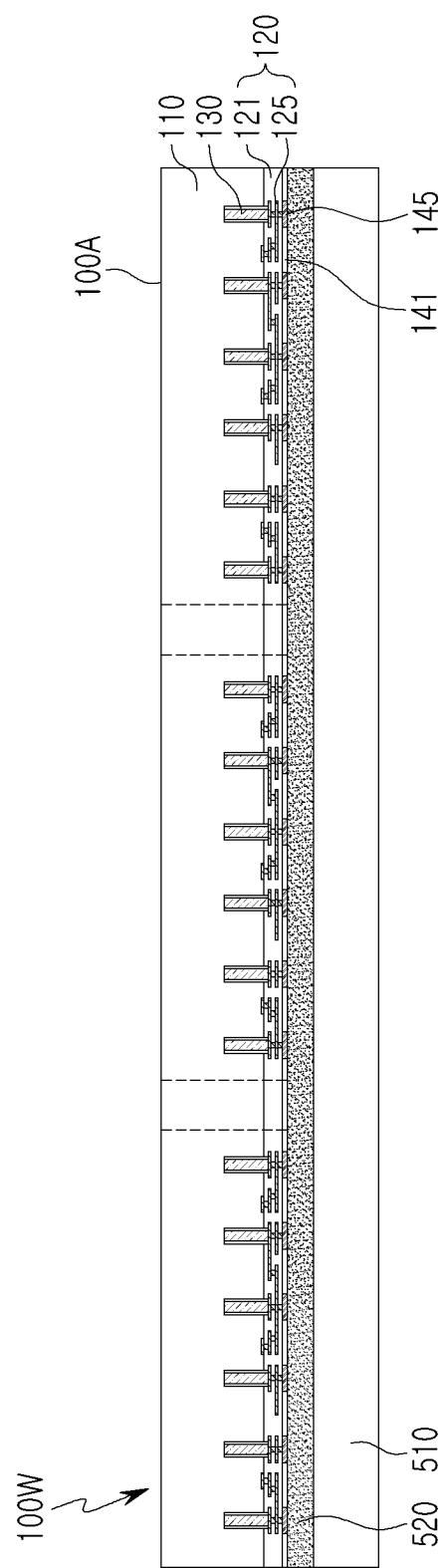
FIGS. 6A to 6D are cross-sectional views for each main process for illustrating a method of manufacturing a semiconductor chip according to an example embodiment of the present inventive concept.

First, referring to FIG. 6A, a semiconductor wafer 100W for a plurality of semiconductor chips 100A may be temporarily bonded to be supported on a carrier substrate 510 using a bonding material layer 520.

In this process, a side of an active surface of the semiconductor wafer 100W may be bonded to face the carrier substrate, and the semiconductor wafer 100W may be stably supported during a subsequent process by an adhesive material such as glue. In the semiconductor wafer 100W, components for the first semiconductor chip 100A may be implemented. Specifically, a through electrode 130 together with a device region, a wiring structure 120 and a lower bonding pad 145 may be formed on the active surface of the semiconductor wafer 100W. The wiring structure 120 may include a low dielectric layer 121 and a plurality of wiring layers 125. The through electrode 130 may be formed in advance to penetrate a partial region of the substrate 110 before or during forming the device region, but may be formed to a depth greater than a thickness of a final semiconductor chip from the active surface. That is, the through electrode 130 may not completely penetrate through the semiconductor wafer 100W.

Figure 6B:
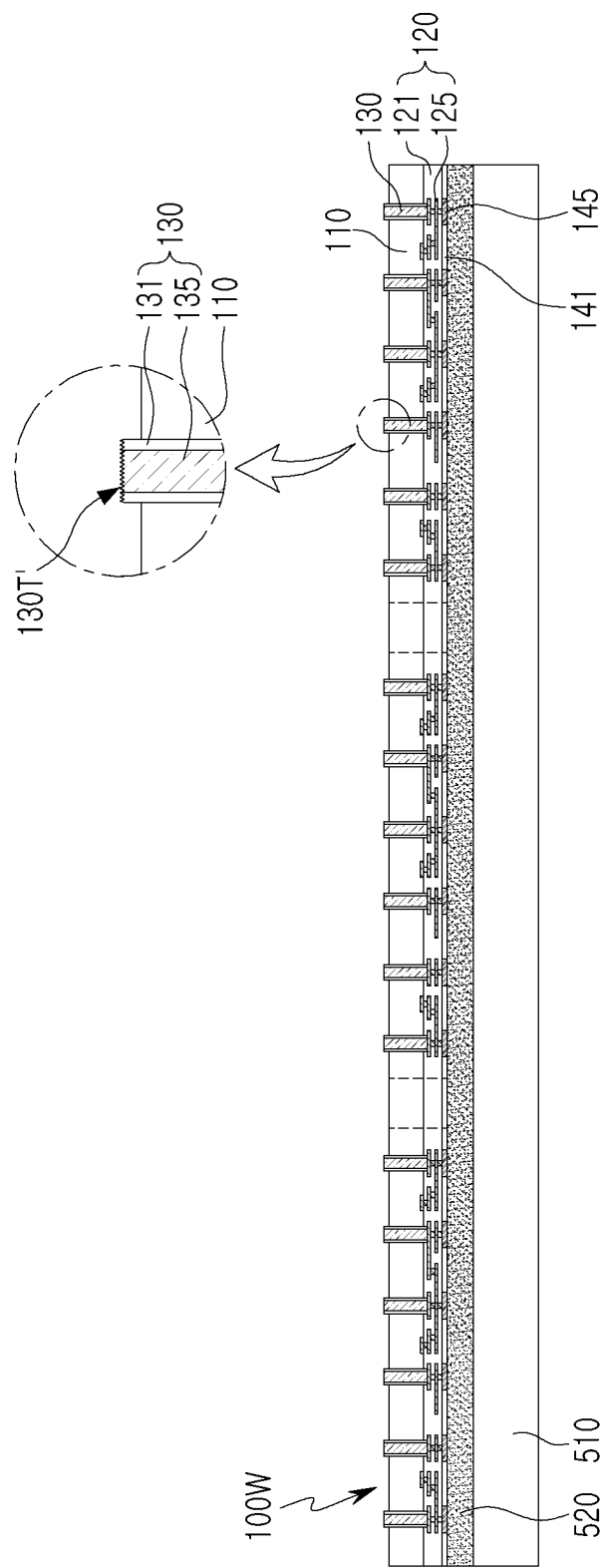

Next, referring to FIG. 6B, a thickness of the semiconductor wafer 100W may be reduced by applying a polishing process to an upper surface (an inactive surface) of the semiconductor wafer 100W.

In the present process, by removing a portion of the semiconductor wafer 100W, an upper end 130T' of the through electrode 130 may protrude from the upper surface of the semiconductor wafer 100W. Through this polishing process, a thickness of the semiconductor wafer 100W may be reduced to a desired thickness of the first semiconductor chip 100A. For this process, a grinding process such as a chemical mechanical polishing (CMP) process, an etch-back process, or a combination thereof may be used. For example, in the present process, a grinding process may be performed to reduce a predetermined thickness of the semiconductor wafer 100W, and etch-back of an appropriate condition may be applied to sufficiently expose the through electrode 130.

Figure 6C:
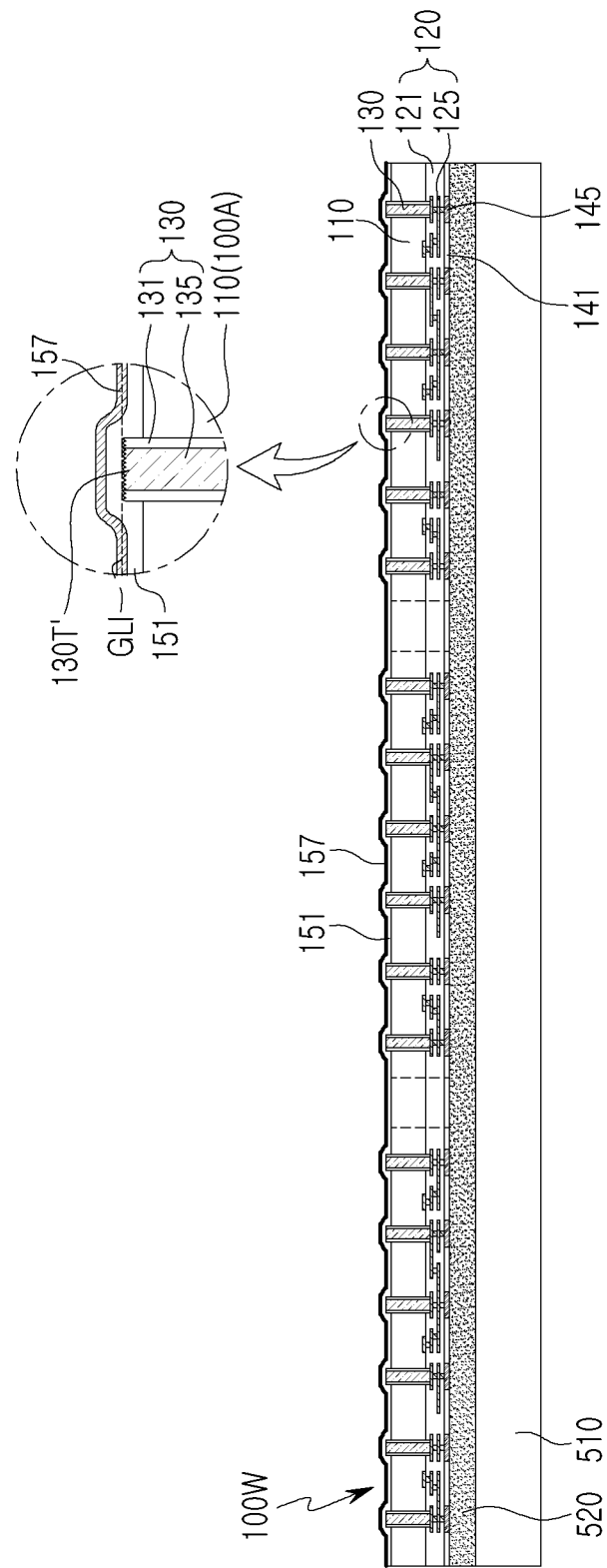

Next, referring to FIG. 6C, an insulating protective layer 151 and a buffer film 157 may be sequentially formed on an upper surface of the semiconductor wafer 100W to cover the exposed upper end 130T' of the through electrode 130. The insulating protective layer 151 may be made of silicon oxide, and the buffer film 157 may be made of silicon nitride or silicon oxynitride.

Figure 6D:
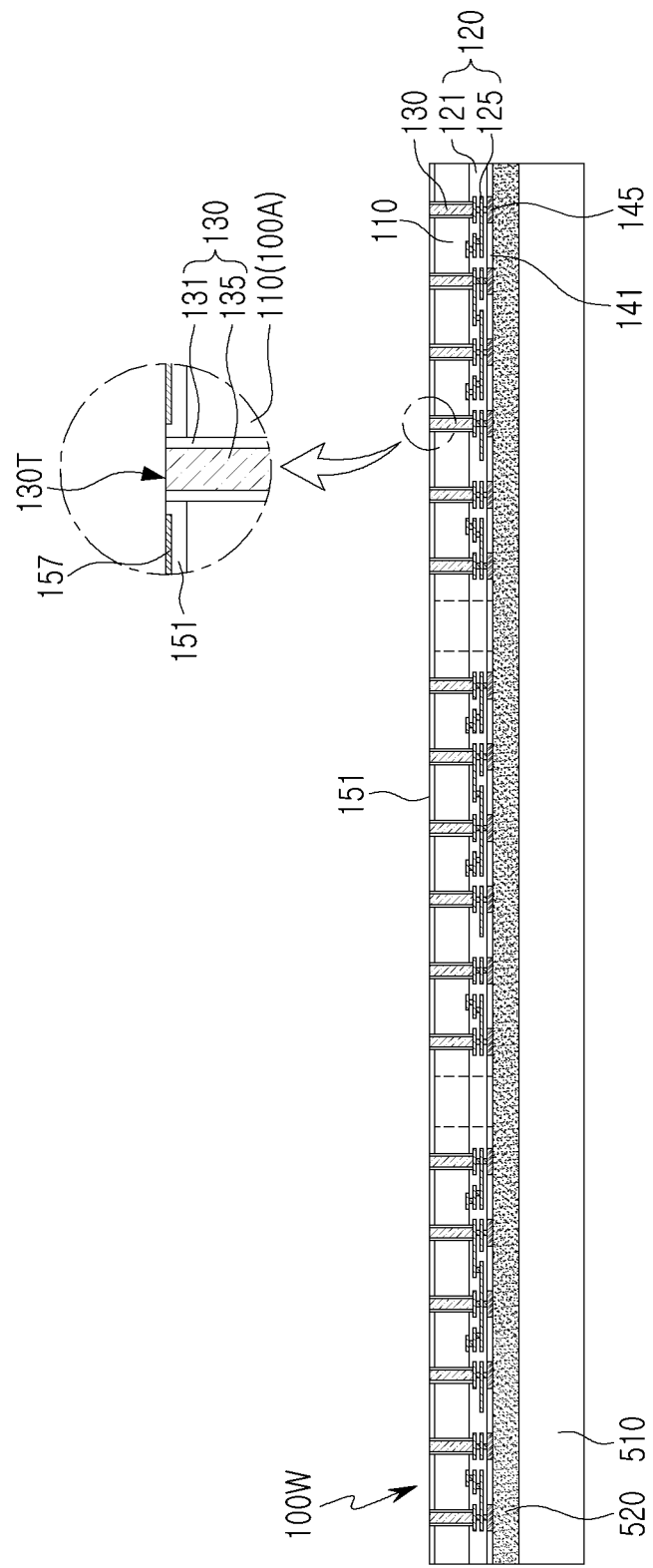

Next, referring to FIG. 6D, the insulating protective layer 151 and the buffer film 157 may be ground to expose an upper end 130T of the through electrode 130. A grinding process may be performed up to a predetermined line GL1 (FIG. 6C) so that the insulating protective layer 151 and the buffer film 157 are partially removed to expose the through electrode 130. Through the present grinding process, the insulating protective layer 151 may have a substantially flat upper surface with the upper end 130T of the through electrode 130. In addition, a damaged portion of the upper end 130T of the through electrode 130 may be removed.

FIGS. 7A to 7F are cross-sectional views for each main process for illustrating a method of forming a bonding structure (a semiconductor chip corresponding to FIG. 3) according to an example embodiment of the present inventive concept.

Figure 7A:
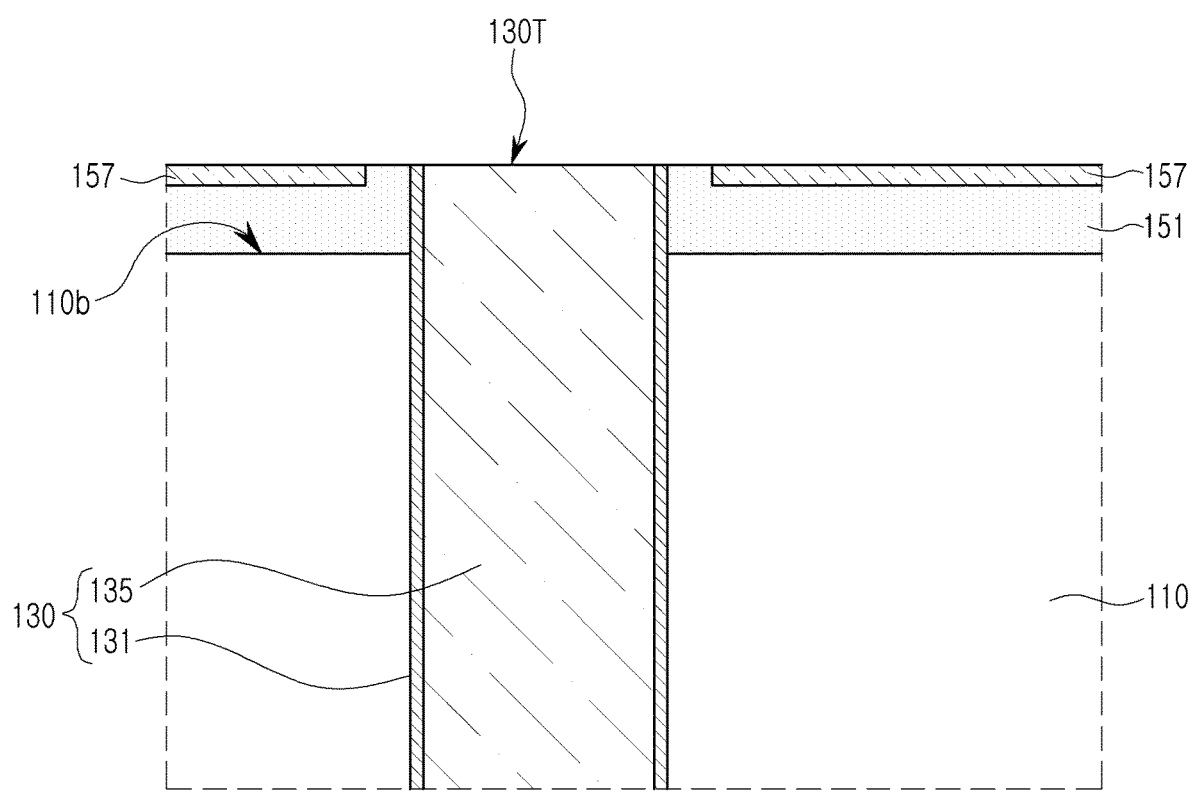
FIGS. 7A to 7F are cross-sectional views illustrating a method of manufacturing the semiconductor chip of FIG. 3 according to an example embodiment of the present inventive concept.

First, a portion illustrated in FIG. 7A corresponds to the portion illustrated in FIG. 3, and may be understood to correspond to a portion of the wafer-level first semiconductor chip 100A manufactured in FIG. 6D. In addition, subsequent processes may be continuously implemented with the wafer level process of FIGS. 6A to OD.

Figure 7B:
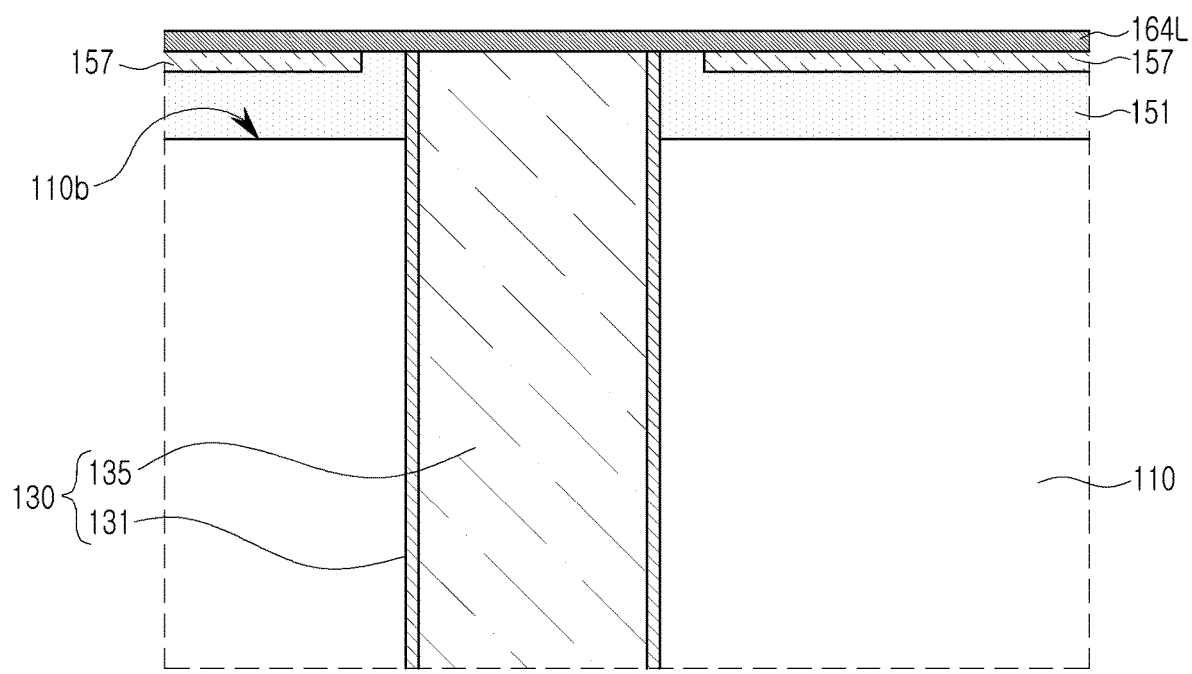

Next, referring to FIG. 7B, a seed layer 164L may be formed on the insulating protective layer 151. The seed layer 164L may be formed to cover a through electrode 130 and a buffer film 157.

Figure 7C:
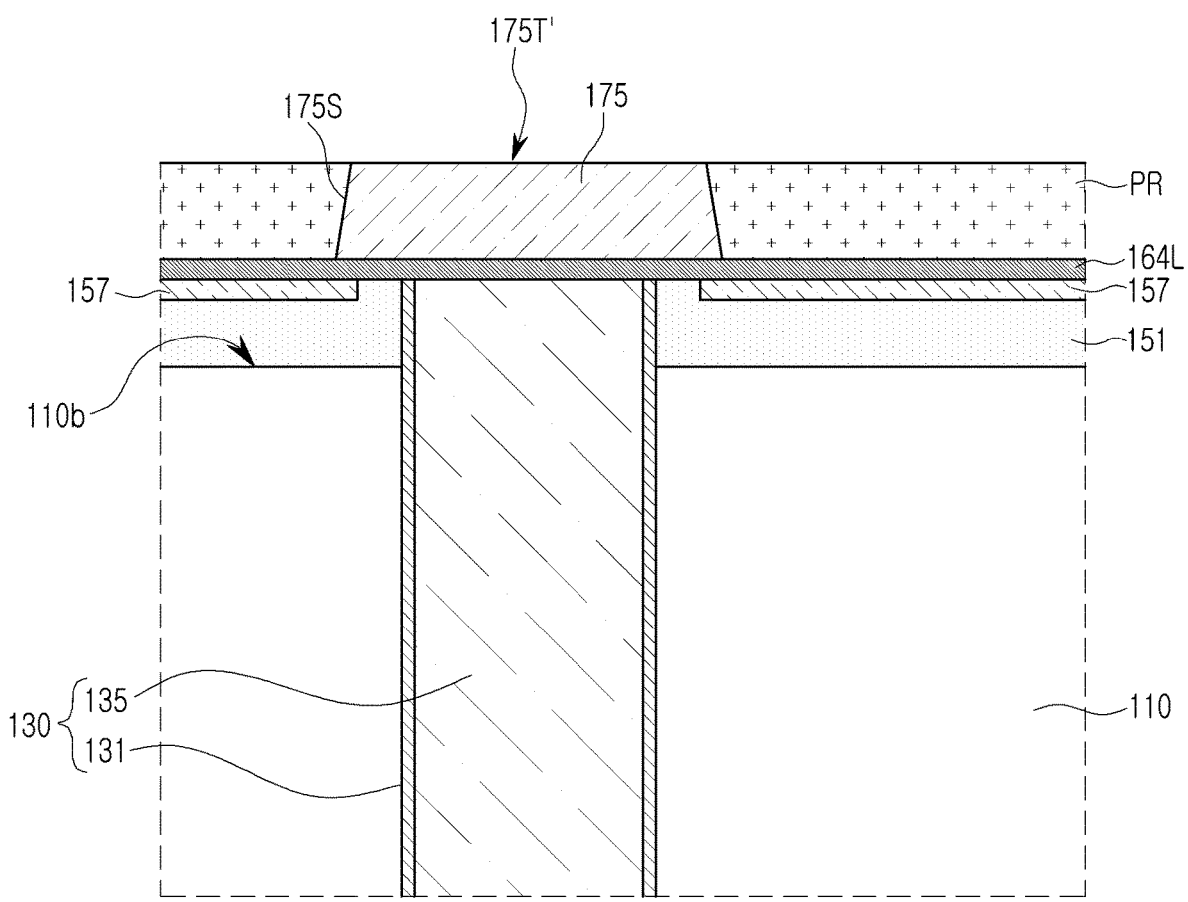

The seed layer 164L is used as a seed for a plating process to form an upper bonding pad (175 in FIG. 7C). For example, the seed layer 164L may include copper (Cu), chromium—copper (Cr—Cu), palladium (Pd), platinum (Pt), gold (Au), or a combination thereof. In addition, the seed layer 164L may have a multilayer structure of a lower layer including titanium (Ti) and an upper layer including copper (Cu).

Next, referring to FIG. 7C, a photoresist pattern PR having an opening may be formed on the seed layer 164L, and an upper bonding pad 175 may be formed in the opening. For example, the upper bonding pad 175 may include Cu.

In the present example embodiment, the opening is provided to define a region in which a bonding pad is formed, and after a photoresist layer is formed, a desired opening may be formed through an exposure/development process. The opening may have a space narrowing toward an upper portion. An upper bonding pad 175 may be formed on a region of the seed layer 164L exposed through the opening by using a plating process. A side surface 175S of the upper bonding pad 175 may have a surface inclined toward an upper surface 175T'.

Figure 7D:
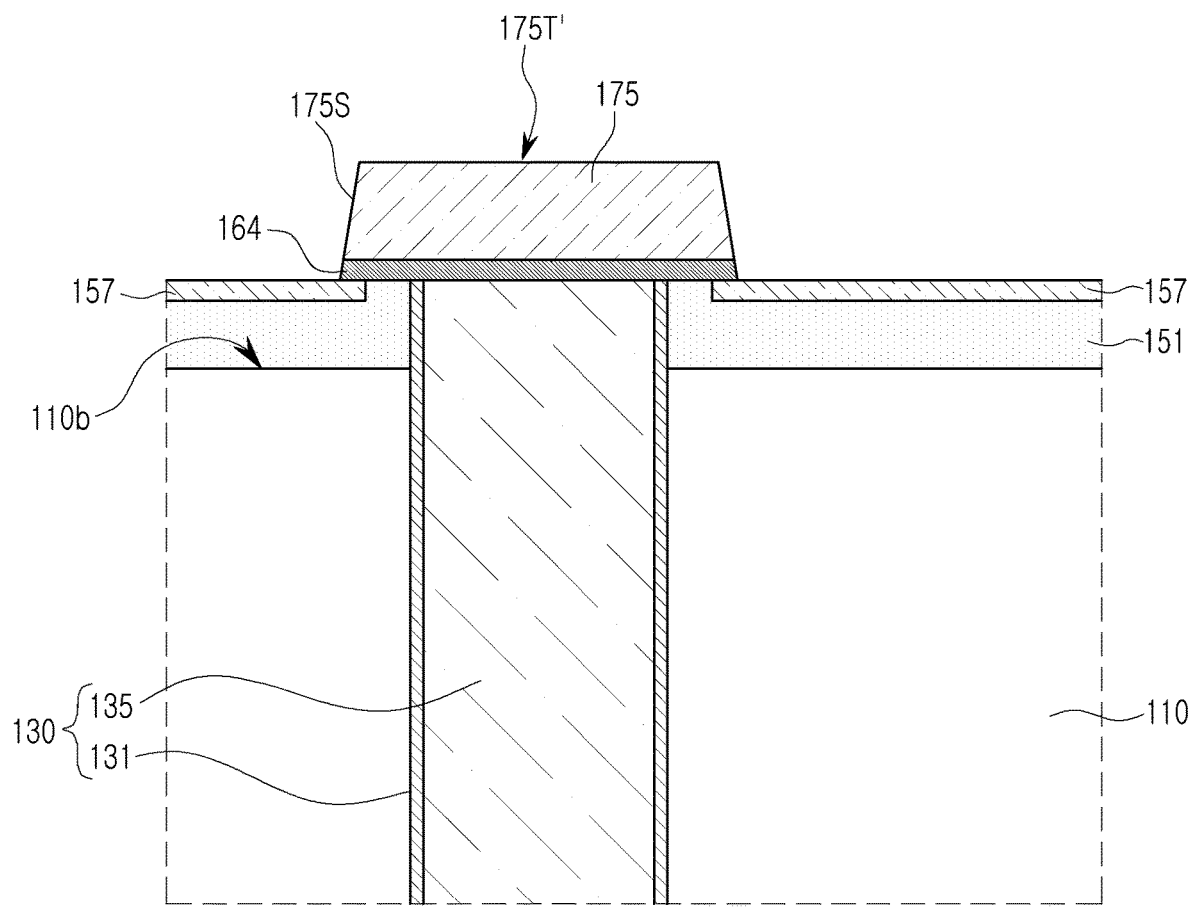

Next, referring to FIG. 7D, a photoresist pattern PR is removed, and exposed portions of the seed layer 164 are removed.

The photoresist pattern PR may be removed using an ashing process. After the photoresist pattern PR is removed, the exposed portion of the seed layer 164 may be etched. A partial region of the seed layer 164 from which the exposed portion is removed may have a region in contact with the insulating protective layer 151 and the buffer film 157.

Figure 7E:
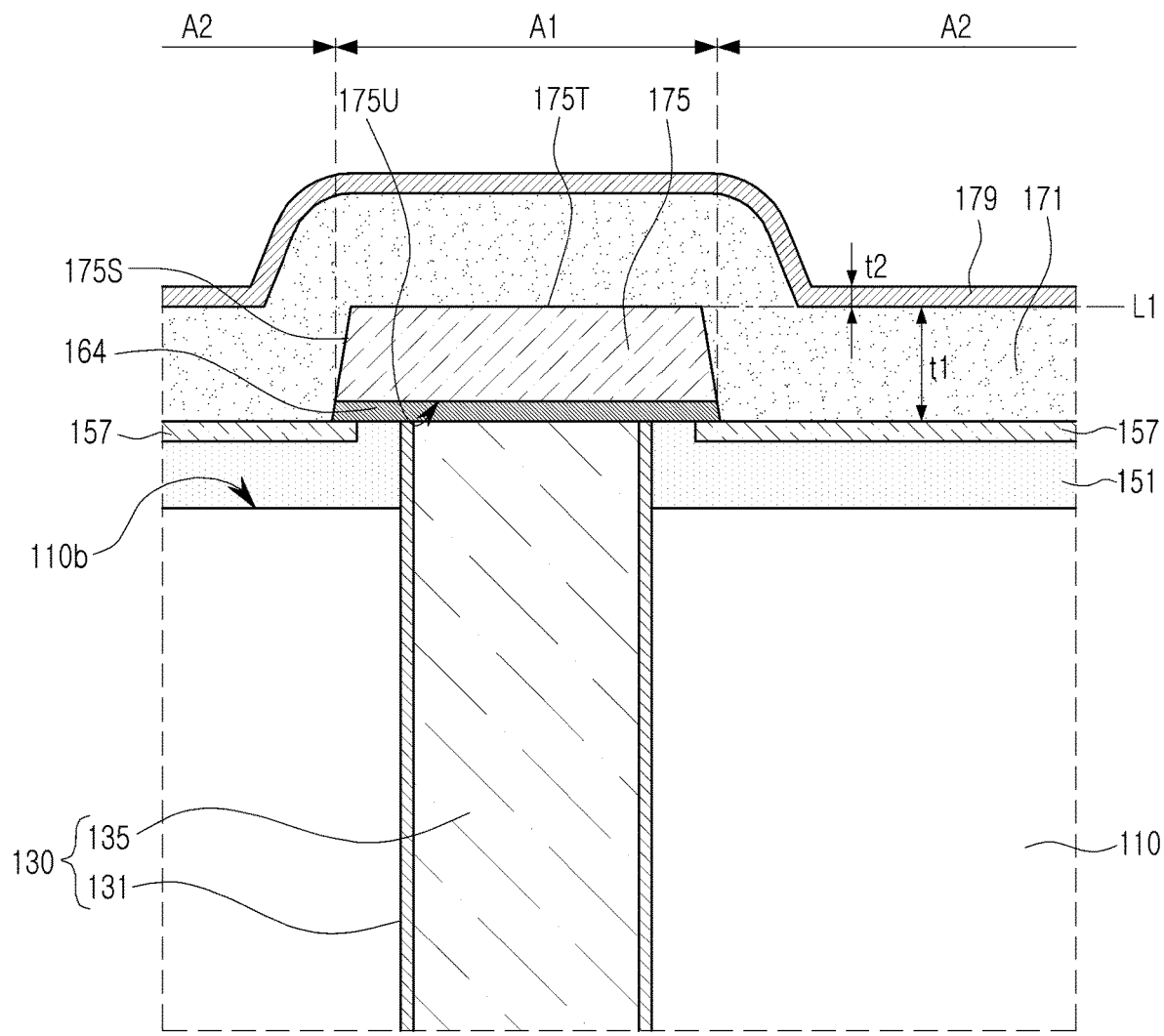

Next, referring to FIG. 7E, an upper insulating layer 171 and a polishing stop film 179 may be sequentially formed to cover the upper bonding pad 175.

For example, the upper insulating layer 171 may include at least one of silicon oxide ($SiO_2$), silicon nitride (SiN), silicon carbide (SiC), silicon oxynitride (SiON), silicon carbonitride (SiCN), aluminum nitride (AlN), aluminum oxynitride (AlON), aluminum oxide (AlO), and aluminum oxide carbide (AlOC).

A level of the polishing stop film 179 may be determined by a thickness t1 of the upper insulating layer 171. For example, the thickness t1 of the upper insulating layer 171 may be substantially equal to a sum of a thickness of the upper bonding pad 175 and a thickness of the seed layer 164. Accordingly, an upper surface of a first region A1 of the upper insulating layer 171 overlapping the upper bonding pad 175 may form an upwardly protruding region (hereinafter referred to as a 'convex portion'), and an upper surface of a second region A2, not overlapping the upper bonding pad 175 may form a flat surface. A lower surface of the first region A1 and the upper surface of the second region A2 of the upper insulating layer 171 may be located at substantially the same level L1. As a result, when the convex portion of the upper insulating layer 171 is removed by polishing using the polishing stop film 179 in a subsequent process, an upper surface 175T of the upper bonding pad 175 may be exposed.

The polishing stop film 179 may be formed on the upper insulating layer 171 to have a uniform thickness t2. Accordingly, the polishing stop film 179 may be formed to be convex along a shape of the convex portion of the upper insulating layer 171. The polishing stop film 179 may be used as a reference of a polishing level in a process of removing the convex portion of the upper insulating layer 171 by polishing to expose the upper surface 175T of the upper bonding pad 175 in a subsequent process. For example, the polishing stop film 179 may include at least one of titanium (Ti), titanium nitride (TiN), tantalum (Ta), and tantalum nitride (TaN). For example, the polishing stop film 179 may be formed to a thickness t2 of 3000 Å to 5000 Å.

Figure 7F:
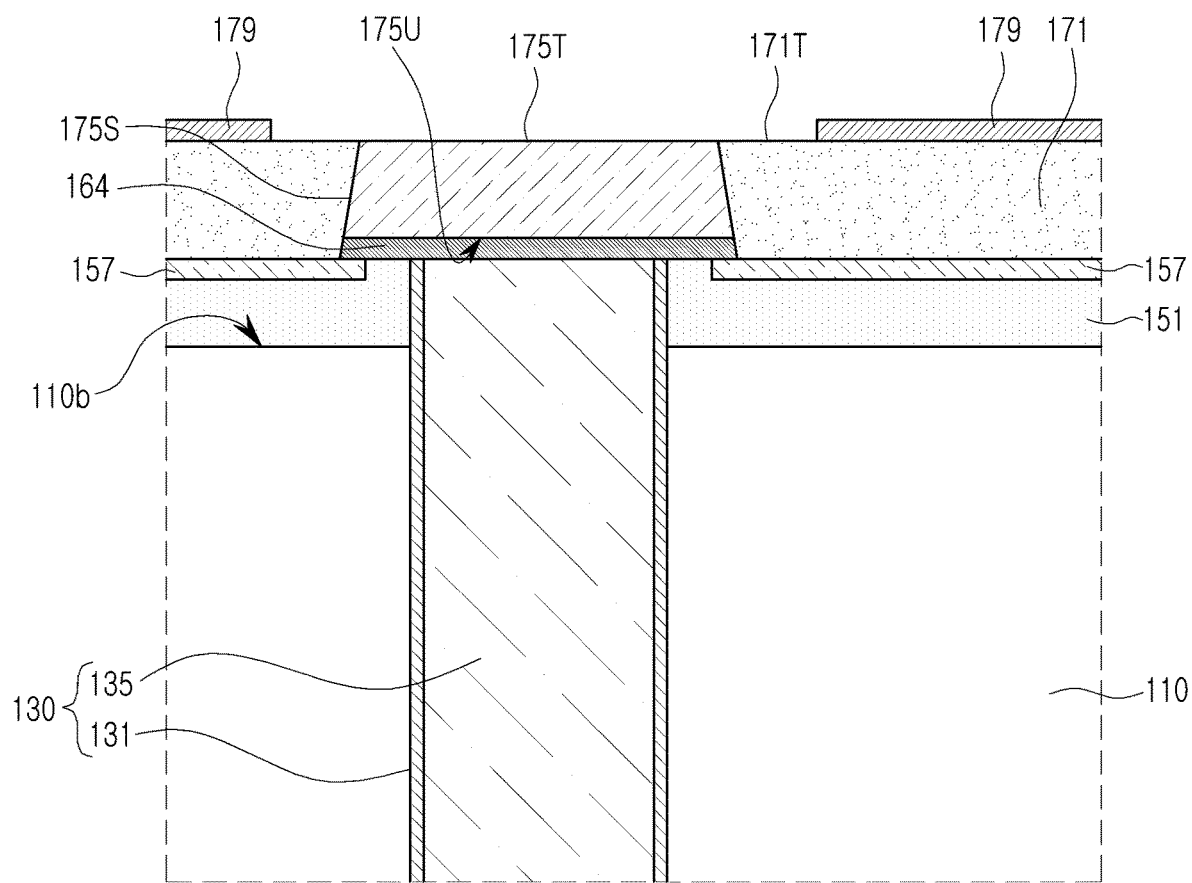

Next, referring to FIG. 7F, an upper surface 175T of the upper bonding pad 175 may be exposed by removing a convex portion of the upper insulating layer 171 using the polishing stop film 179. Such a polishing process may be performed as a CMP process. The CMP process may be performed using a slurry having a higher polishing rate for the upper insulating layer 171 than that for the polishing stop film 179. Accordingly, the convex portion of the upper insulating layer 171 may be removed while the polishing of the polishing stop film 179 is minimized. Through the polishing process, an upper surface 171T of the upper insulating layer 171 may be planarized while removing the convex portion of the upper insulating layer 171 to expose the upper surface 175T of the upper bonding pad 175. In addition, the upper surface 171T of the upper insulating layer 171 and the upper surface 175T of the upper bonding pad 175 may form a substantially flat coplanar surface, as illustrated.

Next, the polishing stop film 179 may be removed to expose the upper insulating layer 171. The removal of the polishing stop film 179 may be performed through a wet etching process. The wet etching process may be performed using an etchant having a higher etch selectivity for the polishing stop film 179 than that for the upper bonding pad 175. As such an etchant, an etchant of an alkali-based or aqueous hydrogen fluoride solution may be used. Accordingly, the polishing stop film 179 may be removed while minimizing damage to the upper surface 175T of the upper bonding pad 175.

Figure 8A:
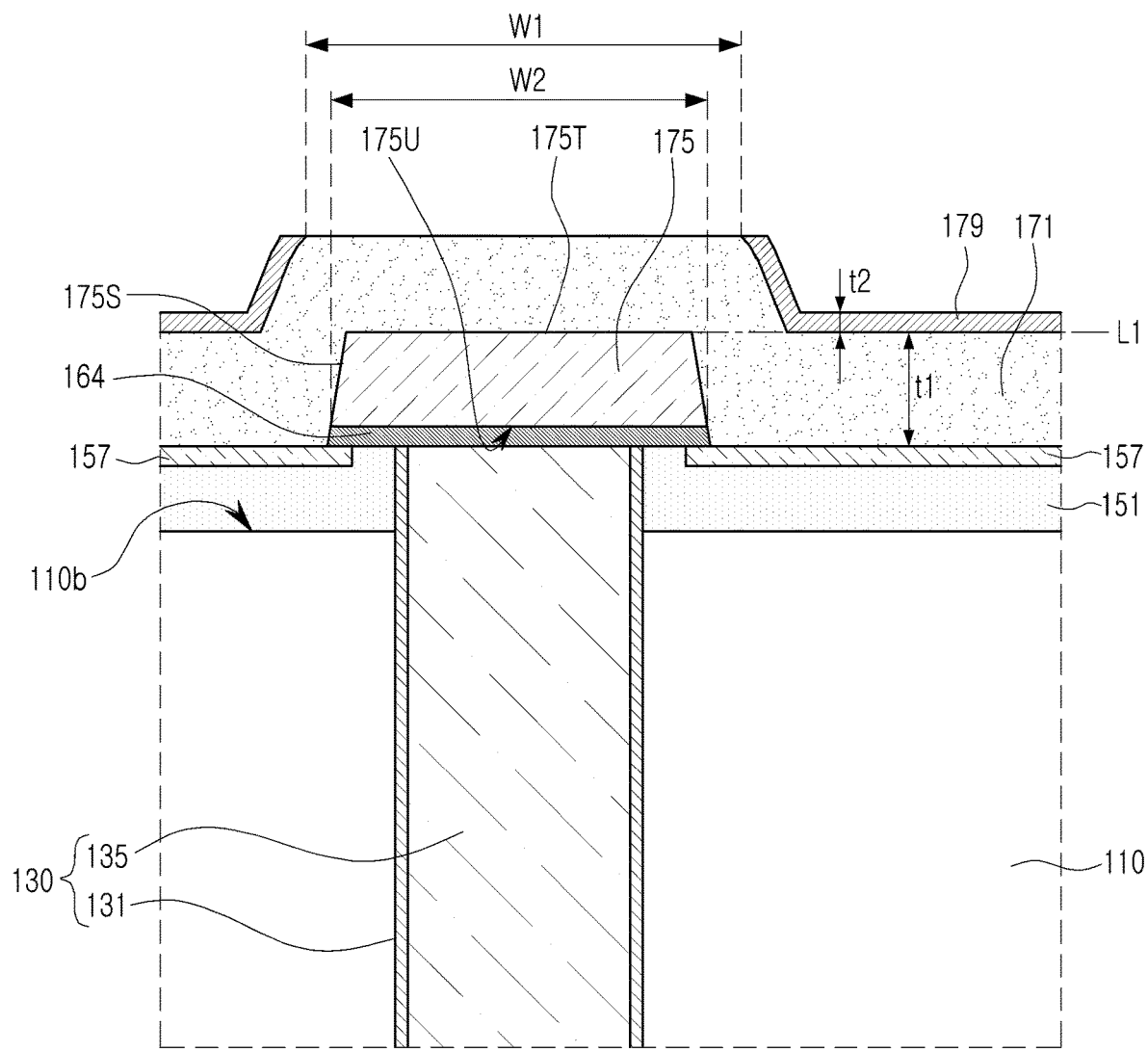
FIGS. 8A and 8B are cross-sectional views illustrating a method of manufacturing the semiconductor chip of FIG. 3 according to an example embodiment of the present inventive concept.
Figure 8B:
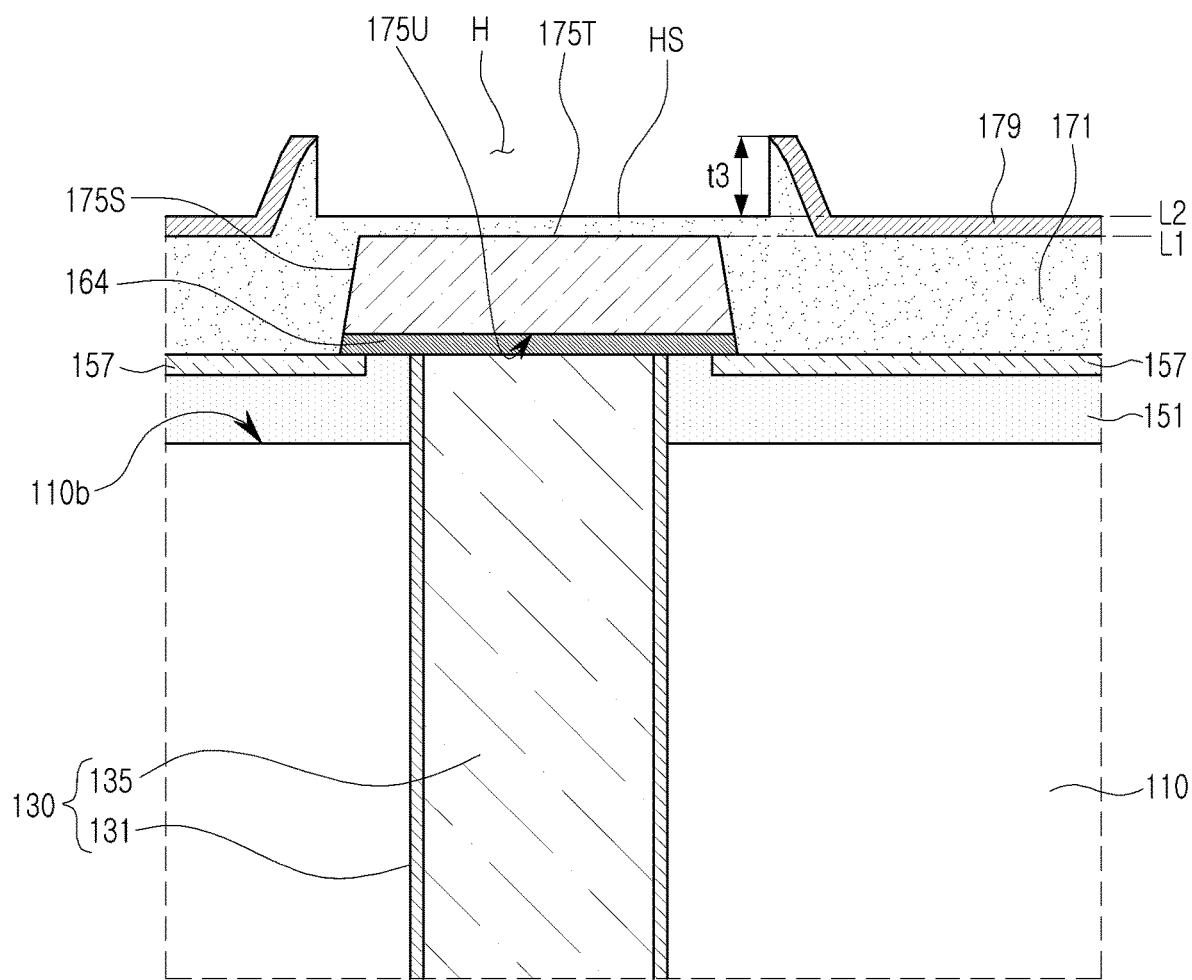

FIGS. 8A and 8B are cross-sectional views for each main process for illustrating a method of forming a semiconductor chip (a semiconductor chip corresponding to FIG. 3) according to an example embodiment of the present inventive concept. Here, the process illustrated in FIG. 8A according to the present example embodiment may be understood as a subsequent process of FIG. 7E.

First, referring to FIG. 8A, an upper portion of a convex portion may be polished to expose a region of an upper insulating layer 171 corresponding to an upper portion of an upper bonding pad 175. A width W1 of the exposed region may be greater than a width W2 of a lower surface 175U of the upper bonding pad 175. Such a polishing process may be performed as a CMP process. The CMP process may be performed using a slurry having a higher polishing rate for a polishing stop film 179 than that for the upper insulating layer 171. Accordingly, an upper portion of the polishing stop film 179 may be removed while minimizing the polishing of the upper insulating layer 171.

Next, referring to FIG. 8B, the exposed upper surface of the upper insulating layer 171 may be dry etched. The dry etching may be performed to a depth t3 such that the upper surface 175U of the upper bonding pad 175 is not exposed. The dry etching may be performed using the polishing stop film 179 as a mask. When the dry etching process is performed, the exposed upper surface of the upper polishing stop film 179 may be anisotropically etched to form a groove portion H. The groove portion H may be formed on a bottom surface HS to a depth t3 such that the upper surface 175T of the upper bonding pad 175 is not exposed. Accordingly, in a subsequent process of removing the upper insulating layer 171, the upper surface 175T of the upper bonding pad 175 may be prevented from being damaged.

Since the subsequent process is the same as the process after FIG. 7F described above, a detailed description thereof will be omitted.

FIGS. 9A to 9E are cross-sectional views for each main process for illustrating a method of manufacturing a semiconductor chip (a semiconductor chip corresponding to FIG. 5) according to an example embodiment of the present inventive concept. Here, the process illustrated in FIG. 9A according to the present example embodiment may be understood as a subsequent process of FIG. 7D.

Figure 9A:
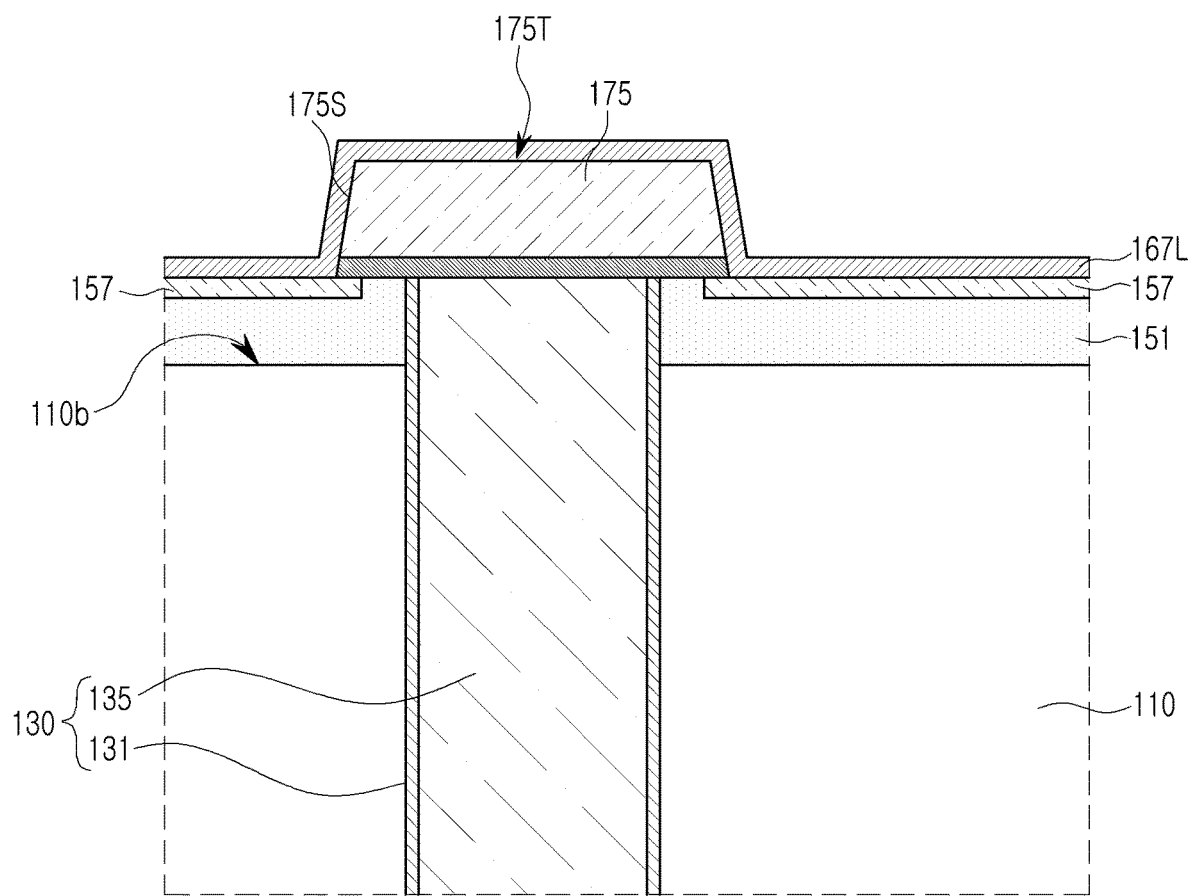
FIGS. 9A to 9E are cross-sectional views illustrating a method of manufacturing the semiconductor chip of FIG. 5 according to an example embodiment of the present inventive concept.

First, referring to FIG. 9A, a capping insulating layer 167L may be formed to cover a surface of an upper bonding pad 175. The capping insulating layer 167L may be continuously formed to cover an upper surface 175T and a side surface 175S of the upper bonding pad 175 and an upper surface of a buffer film 157. The capping insulating layer 167L employed in the present example embodiment may be formed of an insulating material. The capping insulating layer 167L may be formed of the same or similar material as the buffer film 157. For example, the capping insulating layer 167L may include at least one of silicon nitride (SiN), silicon carbide (SiC), silicon oxynitride (SiON), silicon carbonitride (SiCN), aluminum nitride (AlN), aluminum oxynitride (AlON), aluminum oxide (AlO), and aluminum oxide carbide (AlOC). In some example embodiments, the capping insulating layer 167L may have a thickness similar to a thickness of a seed layer 164.

In addition, the capping insulating layer 167L may be formed of a material different from that of the upper insulating layer 171, which will be described later, and may be formed to have a thickness lower than that of the upper insulating layer 171.

Figure 9B:
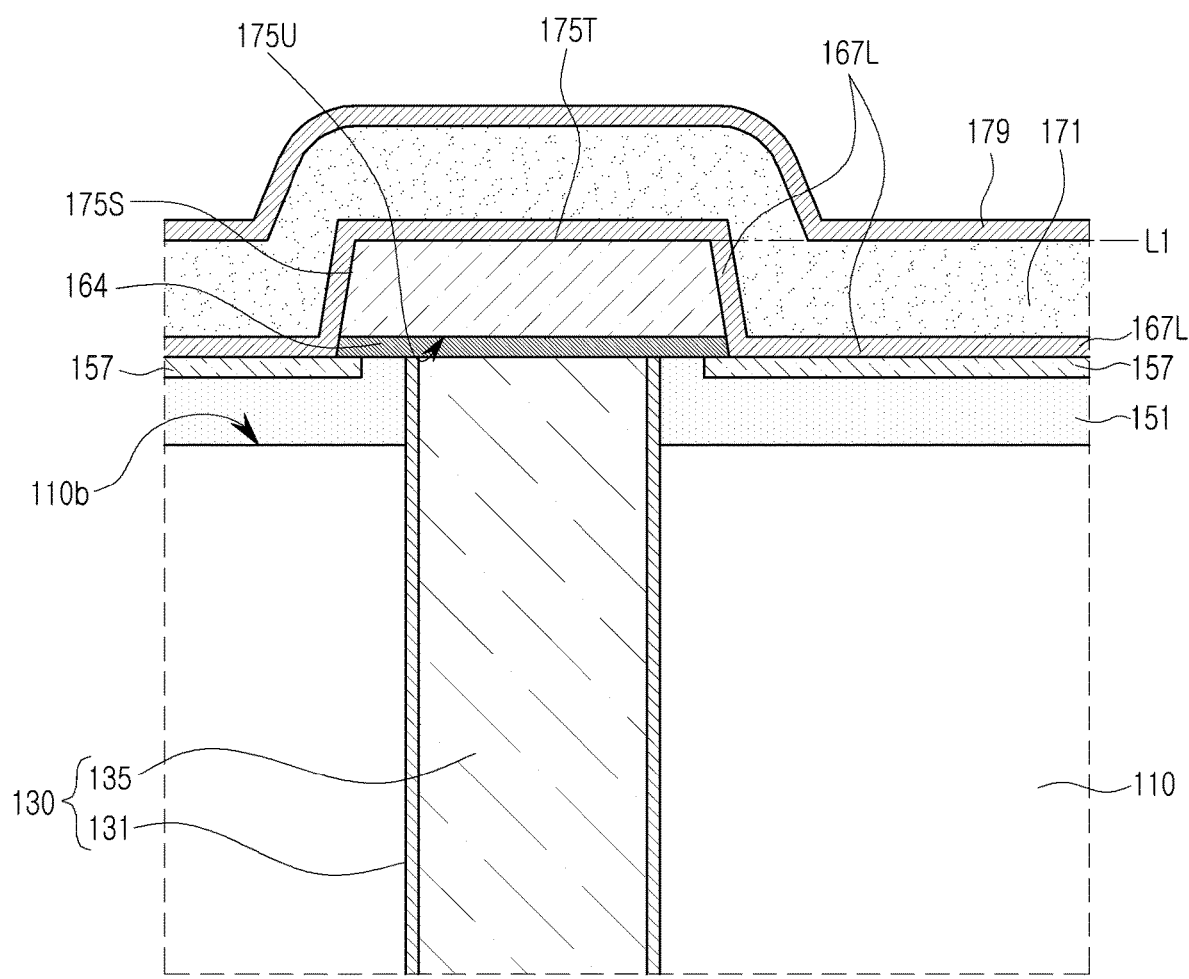

Next, referring to FIG. 9B, an upper insulating layer 171 and a polishing stop film 179 may be sequentially formed to cover the capping insulating layer 167L.

Figure 9C:
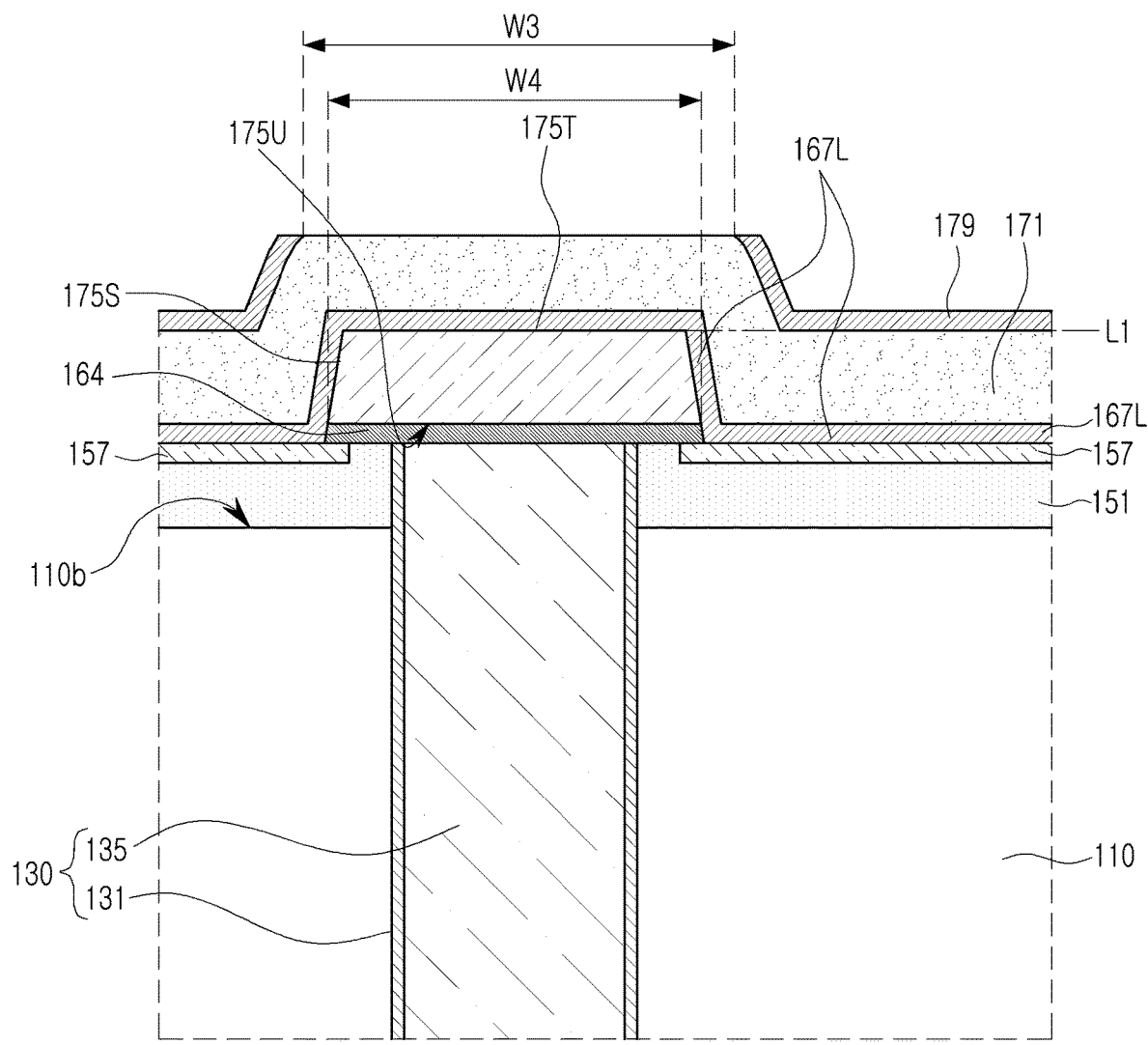

Next, referring to FIG. 9C, an upper portion of a convex portion may be polished to expose a region of an upper insulating layer 171 corresponding to an upper portion of an upper bonding pad 175. A width W3 of the exposed region may be greater than a width W4 of a lower surface 175U of the upper bonding pad 175. Such a polishing process may be performed as a CMP process.

The CMP process may be performed using a slurry having a higher polishing rate for the polishing stop film 179 than that for the upper insulating layer 171. Accordingly, an upper portion of the polishing stop film 179 may be removed while minimizing the polishing of the upper insulating layer 171.

Figure 9D:
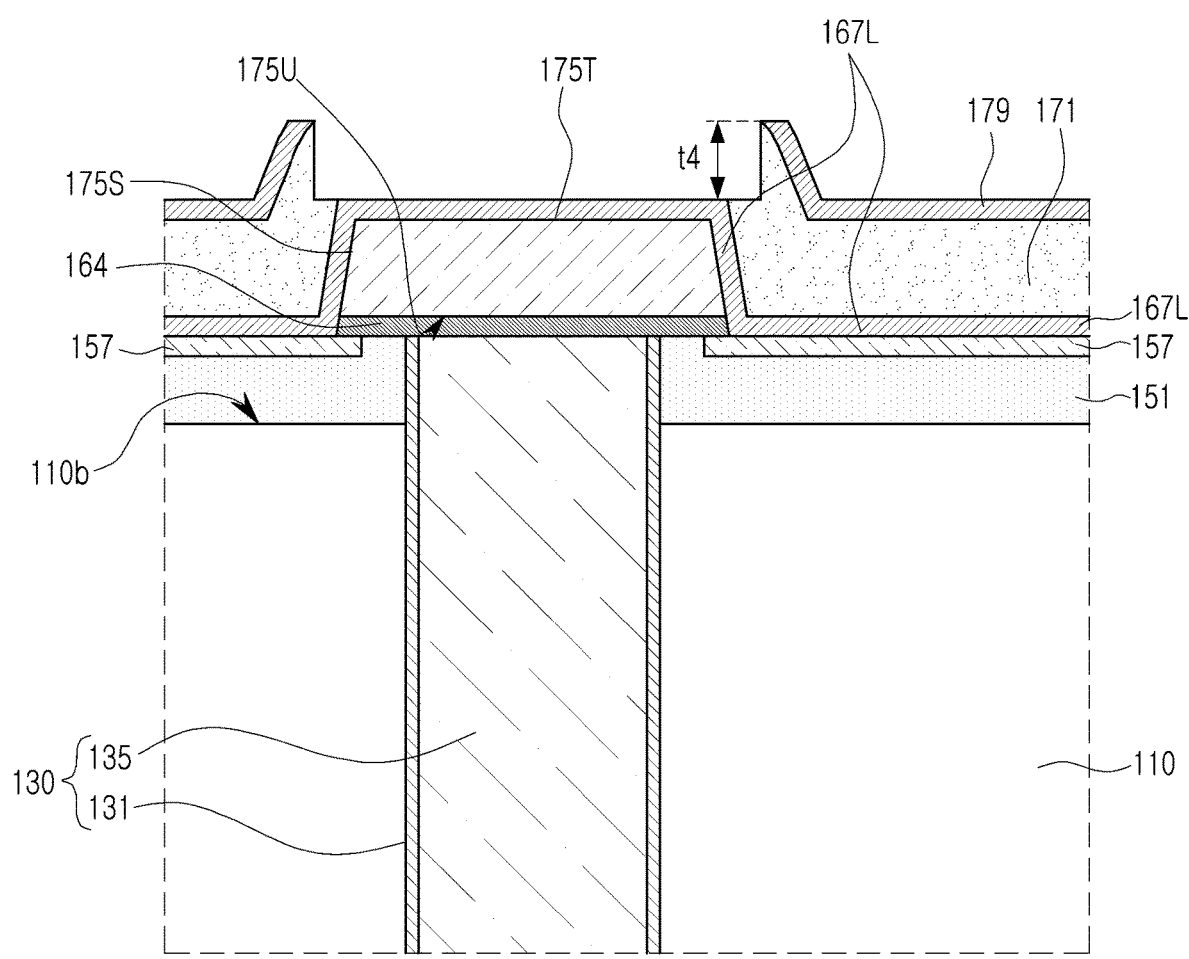

Next, referring to FIG. 9D, the exposed upper surface of the upper insulating layer 171 may be dry etched. The dry etching may be performed to a depth t4 such that an upper surface 175U of the upper bonding pad 175 is not exposed. The dry etching may be performed using the polishing stop film 179 as a mask.

Figure 9E:
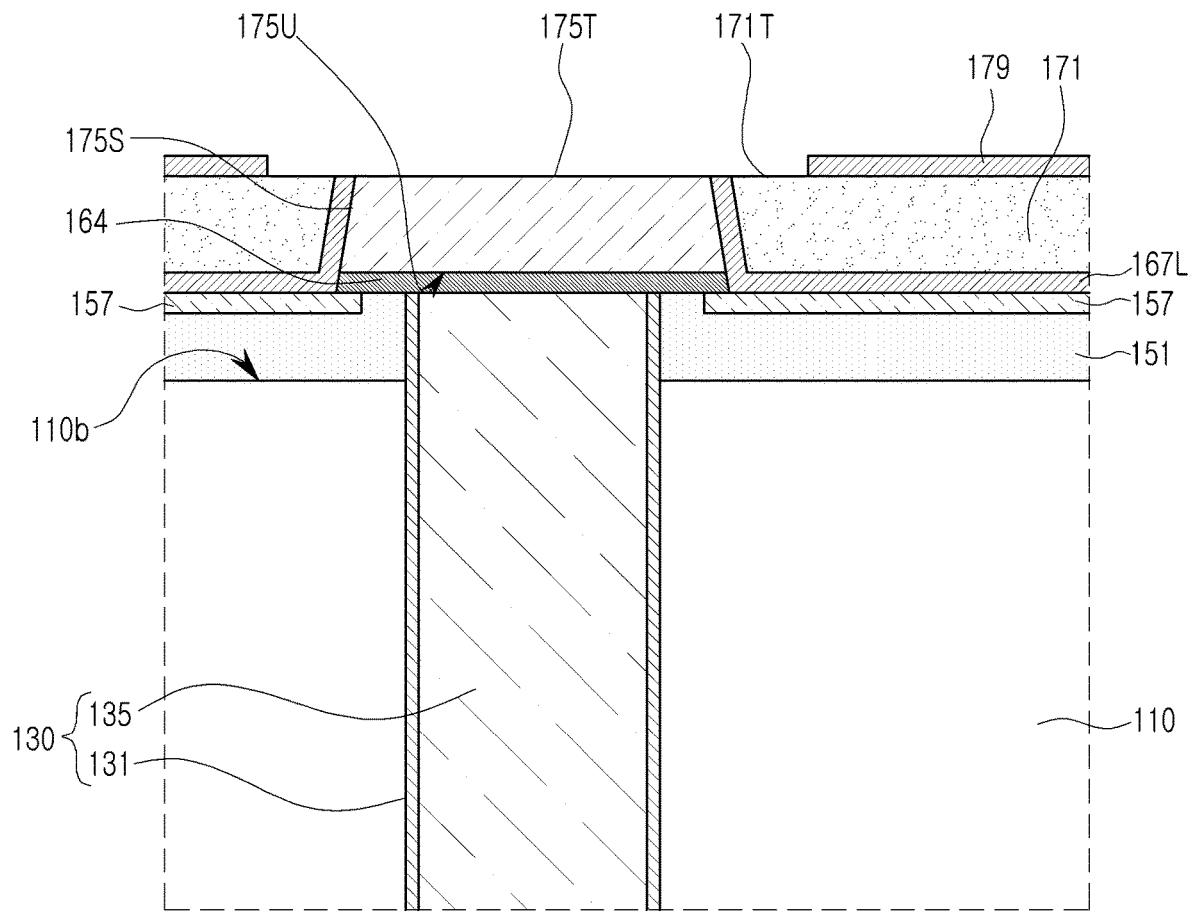

Next, referring to FIG. 9E, a convex portion of the upper insulating layer 171 may be removed using the polishing stop film 179, to expose an upper surface 175T of the upper bonding pad 175. Such a polishing process may be performed as a CMP process. The CMP process may be performed using a slurry having a higher polishing rate for the upper insulating layer 171 than that for the polishing stop film 179.

Accordingly, the convex portion of the upper insulating layer 171 may be removed while the polishing of the polishing stop film 179 is minimized. Through the polishing process, the upper surface 175T of the upper bonding pad 175 may be exposed by removing the convex portion of the upper insulating layer 171 and planarizing the upper surface thereof. In addition, the upper surface 171T of the upper insulating layer 171 and the upper surface of the upper bonding pad 175 may form a substantially flat coplanar surface, as illustrated. Since the subsequent process is the same as the process after FIG. 7F described above, a detailed description thereof will be omitted.

As set forth above, according to the present inventive concept, a semiconductor device having a bonding surface having a flat surface formed therein by forming a bonding pad using a photoresist pattern in advance, and polishing a passivation layer using a polishing stop film, and having a bonding interface having excellent quality may be implemented.

Herein, a lower side, a lower portion, a lower surface, and the like, are used to refer to a direction toward a mounting surface of the fan-out semiconductor package in relation to cross-sections of the drawings, while an upper side, an upper portion, an upper surface, and the like, are used to refer to a direction opposite to the direction. However, these directions are defined for convenience of explanation, and the claims are not limited by the directions defined as described above.

The meaning of a "connection" of a component to another component in the description includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an example embodiment" used herein does not refer to the same example embodiment, and is provided to emphasize a particular feature or characteristic different from that of another example embodiment. However, example embodiments provided herein are considered to be able to be implemented by being combined in whole or in part one with one another. For example, one element described in a particular example embodiment, even if it is not described in another example embodiment, may be understood as a description related to another example embodiment, unless an opposite or contradictory description is provided therein.

Terms used herein are used only in order to describe an example embodiment rather than limiting the present disclosure. In this case, singular forms include plural forms unless interpreted otherwise in context.

While example embodiments have been shown and described above, it will be apparent to those skilled in the art that modifications and variations could be made without departing from the scope of the present inventive concept as defined by the appended claims.

What is claimed is:

1. A method of manufacturing a semiconductor chip, the method comprising:
   forming a photoresist pattern having a plurality of openings on a semiconductor wafer, each of the plurality of openings defining a bonding pad formation region;
   forming a plurality of bonding pads, each bonding pad in a respective one of the plurality of openings;
   removing the photoresist pattern;
   sequentially forming an insulating layer and a polishing stop film on the semiconductor wafer and the plurality of bonding pads, wherein the insulating layer and the polishing stop film form a plurality of convex portions, each convex portion above a respective one of the plurality of bonding pads;
   polishing the plurality of convex portions to expose a plurality of regions of the insulating layer;
   dry etching the exposed plurality of regions of the insulating layer to form a groove in each of the exposed plurality of regions of the insulating layer;
   further polishing the plurality of convex portions to expose an upper surface of each of the plurality of bonding pads; and
   removing the polishing stop film to expose the insulating layer.

2. The method of manufacturing a semiconductor chip of claim 1, wherein the polishing stop film comprises a material that is different from a material of the plurality of bonding pads.

3. The method of manufacturing a semiconductor chip of claim 2, wherein polishing the plurality of convex portions to expose an upper surface of each of the plurality of bonding pads comprises wet etching the polishing stop film using an etchant having higher etch selectivity for the polishing stop film than the plurality of bonding pads.

4. The method of manufacturing a semiconductor chip of claim 1, further comprising, before the forming the photoresist pattern,
forming a seed layer on the semiconductor wafer,
wherein the forming the plurality of bonding pads comprises plating copper (Cu) on the seed layer.

5. The method of manufacturing a semiconductor chip of claim 4, wherein a thickness of the insulating layer is substantially equal to a sum of a thickness of one of the plurality of bonding pads and a thickness of the seed layer.

6. The method of manufacturing a semiconductor chip of claim 4, wherein the seed layer and the polishing stop film comprise a same material.

7. The method of manufacturing a semiconductor chip of claim 4, wherein the polishing stop film comprises at least one of titanium (Ti), titanium nitride (TiN), tantalum (Ta), and tantalum nitride (TaN).

8. The method of manufacturing a semiconductor chip of claim 1, wherein a thickness of the polishing stop film is in a range of 3000 Å to 5000 Å.

9. The method of manufacturing a semiconductor chip of claim 1, wherein a bottom surface of each groove is spaced apart from the upper surface of each of the plurality of bonding pads.

10. The method of manufacturing a semiconductor chip of claim 9, wherein the bottom surface of each groove is spaced apart from the upper surface of the respective one of the plurality of bonding pads by a distance substantially the same as a thickness of the polishing stop film.

11. The method of manufacturing a semiconductor chip of claim 1, wherein the polishing the plurality of convex portions to expose the respective plurality of regions of the insulating layer and the polishing the plurality of convex portions to expose the upper surface of each of the plurality of bonding pads comprise chemical mechanical polishing.

12. The method of manufacturing a semiconductor chip of claim 11, wherein the polishing the plurality of convex portions to expose the respective plurality of regions of the insulating layer comprises using a first slurry having a higher polishing rate for the polishing stop film than the insulating layer,
wherein the polishing the plurality of convex portions to expose the upper surface of each of the plurality of bonding pads comprises using a second slurry having a higher polishing rate for the insulating layer than the polishing stop film.

13. The method of manufacturing a semiconductor chip of claim 1, wherein the insulating layer is in direct contact with the plurality of bonding pads.

14. The method of manufacturing a semiconductor chip of claim 1, wherein the plurality of bonding pads are spaced apart from each other by at least 12 μm.

15. The method of manufacturing a semiconductor chip of claim 1, further comprising, before the forming the insulating layer,
forming a capping insulating layer on side surfaces and upper surfaces of the plurality of bonding pads.

16. The method of manufacturing a semiconductor chip of claim 15, wherein the capping insulating layer comprises a material different from a material of the insulating layer.

17. The method of manufacturing a semiconductor chip of claim 16, wherein the capping insulating layer comprises at least one of silicon nitride (SiN), silicon carbide (SiC), silicon oxynitride (SiON), silicon carbonitride (SiCN), aluminum nitride (AlN), aluminum oxynitride (AlON), aluminum oxide (AlO), and aluminum oxide carbide (AlOC).

18. A method of manufacturing a semiconductor chip, comprising:
forming a plurality of bonding pads on a semiconductor wafer;
sequentially forming an insulating layer and a polishing stop film on the semiconductor wafer and the plurality of bonding pads, wherein the insulating layer and the polishing stop film form a plurality of convex portions, each convex portion above a respective one of the plurality of bonding pads;
polishing the plurality of convex portions to expose an upper surface of each of the plurality of bonding pads; and
removing the polishing stop film.

19. A method of manufacturing a semiconductor chip, comprising:
forming a plurality of bonding pads on a semiconductor wafer;
forming a first insulating layer on the plurality of bonding pads;
sequentially forming a second insulating layer and a polishing stop film on the first insulating layer, the second insulating layer and the polishing stop film forming a plurality of convex portions, each convex portion above a respective one of the plurality of bonding pads;
polishing the plurality of convex portions to expose an upper surface of each of the plurality of bonding pads; and
removing the polishing stop film,
wherein the first insulating layer and the second insulating layer comprise different materials.

20. The method of manufacturing a semiconductor chip of claim 19, wherein a thickness of the first insulating layer is less than a thickness of the second insulating layer.

* * * * *